(12) United States Patent
Lorenz et al.

(10) Patent No.: US 11,531,075 B2
(45) Date of Patent: Dec. 20, 2022

(54) METHOD AND APPARATUS FOR INTEGRATING CURRENT SENSORS IN A POWER SEMICONDUCTOR MODULE

(71) Applicants: Wisconsin Alumni Research Foundation, Madison, WI (US); FUJI ELECTRIC CO., LTD., Kanagawa (JP)

(72) Inventors: Robert D. Lorenz, Madison, WI (US); Minhao Sheng, Madison, WI (US); Hiroyuki Nogawa, Kanagawa (JP); Yoshinari Ikeda, Kanagawa (JP); Eiji Mochizuki, Kanagawa (JP)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 17/397,481

(22) Filed: Aug. 9, 2021

(65) Prior Publication Data

US 2021/0364581 A1 Nov. 25, 2021

Related U.S. Application Data

(62) Division of application No. 15/595,596, filed on May 15, 2017, now Pat. No. 11,085,977.

(51) Int. Cl.
*G01R 33/09* (2006.01)
*G01R 15/20* (2006.01)
(Continued)

(52) U.S. Cl.
CPC ......... *G01R 33/093* (2013.01); *G01R 15/205* (2013.01); *G01R 31/42* (2013.01);
(Continued)

(58) Field of Classification Search
CPC .... G01R 33/093; G01R 15/205; G01R 31/42; G01R 33/091; H01L 24/47
See application file for complete search history.

(56) References Cited

U.S. PATENT DOCUMENTS 6,734,660 B1 5/2004 Berkean et al.
9,116,197 B2 8/2015 Lorenz et al.
(Continued)

OTHER PUBLICATIONS

Brauhn et al.: "Module-Integrated GMR-Based Current Sensing for Closed Loop Control of a Motor Drive"—Proceedings of the 2015 IEEE Energy Conversion Congress Exposition, Montreal, QC, Canada 2015—(8) pp. 342-349.
(Continued)

*Primary Examiner* — Alesa Allgood
(74) *Attorney, Agent, or Firm* — Boyle Fredrickson, SC

(57) ABSTRACT

An improved system for measuring current within a power semiconductor module is disclosed, where the system is integrated within the power module. The system includes a point field detector sensing a magnetic field resulting from current flowing in one phase of the module. A lead frame conductor may be provided to shape the magnetic field and minimize the influence of cross-coupled magnetic fields from currents conducted in other power semiconductor devices within one phase of the module. Optionally, a second point field detector may be provided at a second location within the module to sense a magnetic field resulting from the current flowing in the same phase of the module. Each phase of the power module includes at least one point field detector. A decoupling circuit is provided to decouple multiple currents flowing within the same phase or to decouple currents flowing within different phases of the power module.

20 Claims, 14 Drawing Sheets

(51) Int. Cl.
*G01R 31/42* (2006.01)
*H01L 23/00* (2006.01)
(52) U.S. Cl.
CPC ............ *G01R 33/091* (2013.01); *H01L 24/47* (2013.01); *H01L 2924/13055* (2013.01); *H01L 2924/13091* (2013.01)

(56) References Cited

U.S. PATENT DOCUMENTS

| | | | |
|---|---|---|---|
| 2013/0271135 | A1 | 10/2013 | Ozen et al. |
| 2014/0015524 | A1* | 1/2014 | Lorenz .................. G01R 33/09 324/252 |

OTHER PUBLICATIONS

Patel et al.: "Current Sensing for Automotive Electronics—A Survey"—IEEE Transactions on Vehicular Technology, vol. 58, No. 8, Oct. 2009—(12) pp. 4108-4119.

Xiao et al.: "An Overview of Integratable Current Sensor Technologies"—Proceedings of the Industry Applications Society Conference and Annual Meeting, 2003, vol. 2—(8) pp. 1251-1258.

Motto et al.: "IGBT Module with User Accessible On-Chip Current and Temperature Sensors"—Proceedings of the IEEE Applied Power Electronics Conference and Exposition, 2012—(6) pp. 176-181.

Sensitec GmbH datasheet: "GF705 MagnetoResistive Magnetic Field Sensor"—Jan. 20, 2014—(7) pages.

Reig et al.: "Magnetic Field Sensors Based on Giant Magnetoresistance (GMR) Technology: Applications in Electrical Current Sensing"—Sensors 2009, vol. 9, No. 10, Basel, Switzerland—(24) pp. 7919-7942.

Schneider et al.: "Integrating GMR Field Detectors for High-Bandwidth Current Sensing in Power Electronic Modules": IEEE Transactions on Industry Applications, vol. 48, No. 4, Jul./Aug. 2012—(8) pp. 1432-1439.

Olson et al.: "Using the Dynamic Behavior of Superimposed Fields for Point Field-Based Current Sensing"—Proceedings of the IEEE Applied Power Electronics Conference and Exposition, 2006,—(7) pp. 580-586.

Olson et al.: "Effective Use of Miniature, Multi-point, Field-based Current Sensors Without Magnetic Cores"—Proceedings of the IEEE Industry Applications Conference, 2007, (8) pp. 1426-1433.

Hoffman et al.: "Integration of Point Field Detectors Within Power Electronic Packages to Achieve Multifunctional Sensing"—Proceedings of the ASME 2013 International Technical Conference and Exhibition on Packaging and Integration of Electronic and Photonic Microsystems—(8) pages.

David L. Blackburn: "Temperature Measurements of Semiconductor Devices—A Review"—Proceedings of the IEEE Semiconductor Thermal Measurement and Management Symposium, 2004—(11) pages.

Niu et al.: "Sensing Power MOSFET Junction Temperature Using Gate Drive Turn-On Current Transient Properties" IEEE Transactions on Industry Applications, vol. 52, No. 2, Mar./Apr. 2016—(11) pp. 1677-1687.

Olson et al.: "Integrating Giant Magnetoresistive Current and Thermal Sensors in Power Electronic Modules"—Proceedings of the IEEE Applied Power Electronics Conference and Exposition, 2003, vol. 2—(5) pp. 773-777.

Freire et al.: "A Highly Linear Single p-n Junction Temperature Sensor"—IEEE Transactions on Instrumentation and Measurement, vol. 43, No. 2, Apr. 1994—(6) pp. 127-132.

Kim et al.: "Integrated Current Sensor using Giant Magneto Resistive (GMR) Field Detector for Planar Power Module"—Proceedings of the IEEE Applied Power Electronics Conference and Exposition, 2013—(8) pp. 2498-2505.

Bryan A. Dow: "Integration of GMR-Based Current Sensing for Closed Loop Inverter and Motor Control"—M.S. Thesis—University of Wisconsin-Madison, Aug. 19, 2014—(157) pages.

* cited by examiner

METHOD AND APPARATUS FOR INTEGRATING CURRENT SENSORS IN A POWER SEMICONDUCTOR MODULE

CROSS-REFERENCE TO RELATED APPLICATIONS

This application is a divisional of and claims priority to U.S. application Ser. No. 15/595,596, filed May 15, 2017, the entire contents of which is incorporated herein by reference.

BACKGROUND INFORMATION

The present invention relates to a method and apparatus for measuring current in a power semiconductor module. More specifically, a method and apparatus for integrating a current sensor within the power semiconductor module is disclosed.

As is known to those skilled in the art, power semiconductor devices are commonly used to regulate power flow in electronic devices. Power is commonly provided at a fixed voltage and frequency, as may be supplied by a utility grid. However, electronic devices may require power at a difference voltage and/or frequency for operation. Similarly, power may be provided as either an Alternating Current (AC) voltage or as a Direct Current (DC) and the electronic device, or a portion thereof, may require power in the other form. Power semiconductor devices are multi-terminal devices that may have a first terminal connected to the power supplied to the device, a second terminal providing the desired output power, and a third terminal that selectively enables the device to establish electrical conduction between the first and second terminals. Many topologies exist to arrange one or more power semiconductor devices between the input power and the desired output power, and many methods exist to selectively enable the devices to regulate the power flow from the input to the output of the devices.

In many power converters, multiple power semiconductors are utilized to regulate the power flow. While a single power semiconductor device may be able to step up or step down a DC voltage level, adding additional power semiconductor devices may allow, for example, multiple output voltages, bi-directional power flow, conversion between AC and DC, or a combination thereof. Further, AC current may be provided as a multi-phase current and one or more devices may be required for each phase. As a result, it is common to package multiple power semiconductor devices in a single power module. A power module may then be selected that contains the proper number of power semiconductor devices for a desired power conversion operation. An appropriate control method is also selected to generate switching signals for each of the power semiconductor devices within the module to control which device is conducting power between the input and the output of the module.

In many of the control methods used to generate the switching signals, it is desirable to have knowledge of the current flow through one or more of the devices within the module. Historically, it was known to provide a current sensor external to the power module that measured the current at an output terminal of the module. A number of different types of sensor may be utilized. A shunt resistor may be connected between the output terminal and a known voltage reference, such as ground, and the voltage potential across the shunt resistor is measured. The voltage potential is directly proportional to the current output from the module in accordance with Ohm's law. Optionally, a magnetic field based sensing technique may be utilized. The magnetic field based sensors include, for example, current transformers or Hall-effect transducers. Current transformers include a ferromagnetic core with multiple windings wrapped around the core. The current output from the module is conducted in a primary winding and another current, which may be used for measurement, is induced in a secondary winding. Hall-effect transducers utilize a ferromagnetic core to concentrate the magnetic field generated by the current being sensed. A Hall-effect detector is placed in the air gap of the ferromagnetic core to measure the concentrated magnetic field.

However, each of the aforementioned sensors are not without certain disadvantages. A shunt resistor, for example, is susceptible to inaccuracy due to temperature fluctuation, flux coupling between leads, and are not galvanically isolated from the conductor in which they are measuring current. The current transformer is bulky and requires a ferromagnetic core. Low frequency and/or DC components of the current cannot be measured, and high frequency components in the current can result in over heating of the core due to hysteresis loss and eddy currents in the transformer. Similar to the current-transformer, Hall-effect transducers are bulky and costly due to the ferromagnetic core. The measurement bandwidth and accuracy is also limited by hysteresis loss and eddy currents.

Thus, it would be desirable to provide an improved system for measuring current within a power semiconductor module.

In addition, power semiconductor modules are continually being reduced in size. The physical construction of the module allows for higher capacity modules to be formed in modules having a reduced size. The continued trend of power electronic devices is to provide increasing capacity in a reduced footprint.

Thus, it would be desirable to provide a current sensor integrated within the power module to eliminate the space required for an external current sensor.

A prior system for integrating a current sensor in a device is disclosed, for example, in U.S. Pat. No. 9,116,197. The system disclosed by the '197 patent requires a curved interconnect connected between a direct copper bonded (DCB) substrate and output terminals. The curved interconnect is designed to shape the magnetic field formed by the current flowing through the interconnect. A giant magnetoresistive (GMR) sensor is positioned within the interior of the curve at a location selected as a result of shaping the magnetic field. The disclosed system, therefore, requires a curved interconnect and positioning of the GMR sensor in space within the curved sensor during assembly, which results in challenges during manufacture and assembly of the device.

Thus, it would be desirable to provide an improved system and method for integrating a current sensor within a power module.

BRIEF DESCRIPTION

The subject matter disclosed herein describes an improved system for measuring current within a power semiconductor module, where the system is integrated within the power module. The system includes a point field detector sensing a magnetic field resulting from current flowing in one phase of the module. A lead frame conductor may be provided to shape the magnetic field to a desired field strength and a desired bandwidth. The lead frame conductor also minimizes the influence of cross-coupled magnetic fields from currents conducted in other power semiconductor devices within one phase of the module. Optionally, a second point field detector may be provided at a second location within the module to sense a magnetic field resulting from the current flowing in the same phase of the module. Each phase of the power module includes at least one point field detector. A decoupling circuit is provided to decouple multiple currents flowing within the same phase or to decouple currents flowing within different phases of the power module.

According to one embodiment of the invention, a current sensor for integration in a power semiconductor module includes a first electrical conductor, a second electrical conductor, a first magnetic field detector, a second magnetic field detector, and a decoupling circuit. The first electrical conductor includes a first end, configured to be electrically connected to a first conductive substrate within the power semiconductor module, and a second end, configured to be electrically connected to a first terminal of the power semiconductor module. The first conductive substrate is electrically connected to a first switching element within the power semiconductor module. The second electrical conductor includes a first end, configured to be electrically connected to a second conductive substrate within the power semiconductor module, and a second end, configured to be electrically connected to a second terminal of the power semiconductor module. The second conductive substrate is electrically connected to a second switching element within the power semiconductor module. The first magnetic field detector is mounted adjacent to a predefined location on the first electrical conductor, and the first magnetic field detector generates a first signal corresponding to a first magnetic field present at the first magnetic field detector. The first magnetic field is generated by a first current conducted within the first switching element and by a second current conducted within the power semiconductor module. The second magnetic field detector is mounted at a second location within the power semiconductor module, and the second magnetic field detector generates a second signal corresponding to a second magnetic field present at the second magnetic field detector. The second magnetic field is generated by the first current conducted within the first switching element and by the second current conducted within the power semiconductor module. The decoupling circuit is mounted within the power semiconductor module. The decoupling circuit is configured to receive the first signal and the second signal as inputs and to generate an output signal corresponding to the first current.

According to one aspect of the invention, the second magnetic field detector is mounted adjacent to a second predefined location within the power semiconductor device along which the first current is conducted, and the decoupling circuit is configured to decouple intra-phase currents.

According to another aspect of the invention, the second current is conducted through the second switching element, the second magnetic field detector is mounted adjacent to a predefined location on the second electrical conductor, and the decoupling circuit is configured to decouple inter-phase currents.

According to still another aspect of the invention, the first electrical conductor further includes a first conductive body extending between the first end and the second end of the first electrical conductor. The first conductive body has a first predefined spatial geometry, including a plurality of planar surfaces, and each planar surface of the first conductive body is orthogonally connected to at least one of the other planar surfaces of the first conductive body. The second electrical conductor further includes a second conductive body extending between the first end and the second end of the second electrical conductor. The second conductive body has a second predefined spatial geometry, including a plurality of planar surfaces, and each planar surface of the second conductive body is orthogonally connected to at least one of the other planar surfaces of the second conductive body. Each of the first and second predefined locations may have a normalized magnetic field strength that deviates less than five percent over a predefined range of current conducted through the corresponding electrical conductor, and the predefined range of current has a uniform amplitude and a varying frequency between zero hertz and one hundred kilohertz.

According to still other aspects of the invention, the first magnetic field detector and the second magnetic field detector may each be magneto resistive magnetic field detectors. The power semiconductor module may be configured to generate a multiphase output, where the first current corresponds to a current conducted in a first phase of the multiphase output and the second current corresponds to a current conducted in a second phase of the multiphase output.

According to yet another aspect of the invention, the decoupling circuit may include a linear circuit configured to execute a decoupling matrix. The linear circuit includes at least one electronic device defining a coefficient of the decoupling matrix that is laser trimmable to adjust a component value from an initial component value to a final component value.

In still another aspect of the invention, the power semiconductor module is configured to output a three-phase output. The decoupling circuit is a first decoupling circuit, and the second current is conducted through the second switching element. The second magnetic field detector is mounted adjacent to a predefined location on the second electrical conductor. The current sensor further includes a third electrical conductor, a third magnetic field detector, a second decoupling circuit, and a third decoupling circuit. The third electrical conductor includes a first end, configured to be electrically connected to a third conductive substrate within the power semiconductor module, and a second end, configured to be electrically connected to a third terminal of the power semiconductor module. The third conductive substrate is electrically connected to a third switching element within the power semiconductor module. The third magnetic field detector is mounted adjacent to a predefined location on the third electrical conductor. The third magnetic field detector generates a third signal corresponding to a third magnetic field present at the third magnetic field detector. The third magnetic field is generated by a third current conducted within the third switching element and by the second current. The second decoupling circuit is mounted within the power semiconductor module. The second decoupling circuit is configured to receive at least the first signal and the second signal as inputs and to generate an output signal corresponding to the second current. The third decoupling circuit is mounted within the power semiconductor module. The third decoupling circuit is configured to receive at least the second signal and the third signal as inputs and to generate an output signal corresponding to the third current.

The first magnetic field may be generated as a function of the first current conducted within the first switching element, the second current conducted within the second switching element, and the third current conducted within the third switching element. The second magnetic field may be generated as a function of the first current conducted within the first switching element, the second current conducted within the second switching element, and the third current conducted within the third switching element. The third magnetic field may be generated as a function of the first current conducted within the first switching element, the second current conducted within the second switching element, and the third current conducted within the third switching element. The first decoupling circuit may be configured to receive the first signal, the second signal, and the third signal as inputs and to generate a first output signal corresponding to the first current. The second decoupling circuit may be configured to receive the first signal, the second signal, and the third signal as inputs and to generate a second output signal corresponding to the second current. The third decoupling circuit may be configured to receive the first signal, the second signal, and the third signal as inputs and to generate a third output signal corresponding to the third current.

According to another embodiment of the invention, a method for integrating a current sensor in a power semiconductor module includes mounting a first magnetic field detector at a first location in the power semiconductor module and mounting a second magnetic field detector at a second location in the power semiconductor module. The first magnetic field detector generates a first feedback signal corresponding to a first magnetic field present at the first magnetic field detector and generated in response to at least a first current and a second current. The first current is conducted in a first electrical conductor within the power semiconductor module, and the second current is conducted within the power semiconductor module. The second magnetic field detector generates a second feedback signal corresponding to a second magnetic field present at the second magnetic field detector and generated in response to at least the first current and the second current. The method further includes mounting a decoupling circuit within the power semiconductor module. The first feedback signal and the second feedback signal are connected as inputs to the decoupling circuit, and the decoupling circuit generates an output signal corresponding to the first current as a function of the first feedback signal and of the second feedback signal.

According to another aspect of the invention, the method further comprises an initial step of connecting the first electrical conductor between a first electrical connection point and a second electrical connection point within the power semiconductor module. The first electrical conductor has a definite spatial geometry between the first and the second electrical connection points, and the first electrical connection point is a conductive substrate connected to a first switching element within the power semiconductor module. The second electrical connection point is a first output terminal, and the first location is a predefined location adjacent to the first electrical conductor.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

Figure 1:
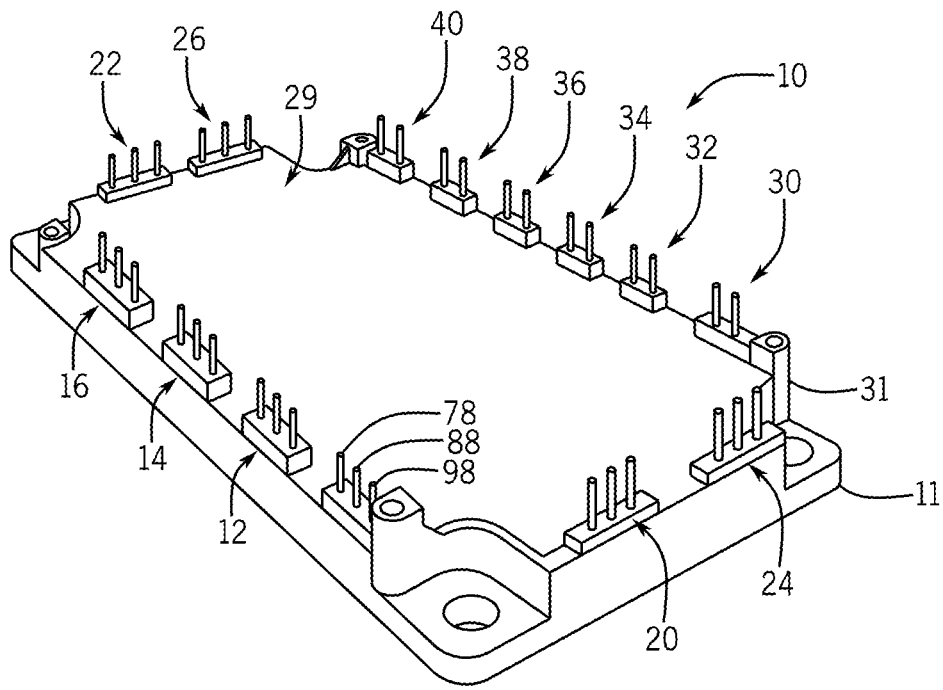
FIG. 1 is an isometric view of an exemplary power semiconductor module incorporating one embodiment of the invention.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

Turning initially to FIG. 1, an exemplary power semiconductor module 10 is illustrated in which a current sensor according to the embodiments of the present invention discussed herein may be integrated. The illustrated power semiconductor module 10 is referred to as a "six-pack" because it includes six power semiconductor switches and their corresponding anti-parallel diodes. The power semiconductor module 10 is configured to be connected to a DC power source and provide a three-phase power output. The exemplary power semiconductor module 10 will be used for description herein but is not intended to be limiting. It is understood that the integrated current sensor discussed herein may be implemented in power semiconductor modules having other configurations including, but not limited to, other numbers of power semiconductor switches, multi-level or alternating current power sources, or power semiconductor switches without anti-parallel diodes.

Figure 2:
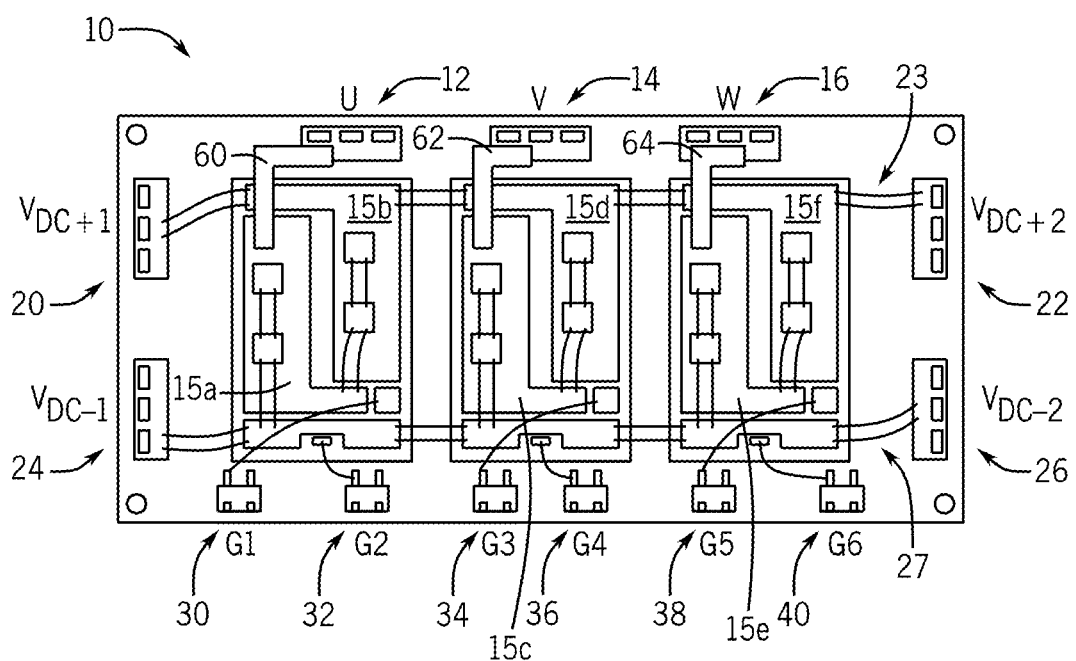
FIG. 2 is a top schematic view of the power semiconductor module of FIG. 1 with a decoupling circuit board removed.
Figure 3:
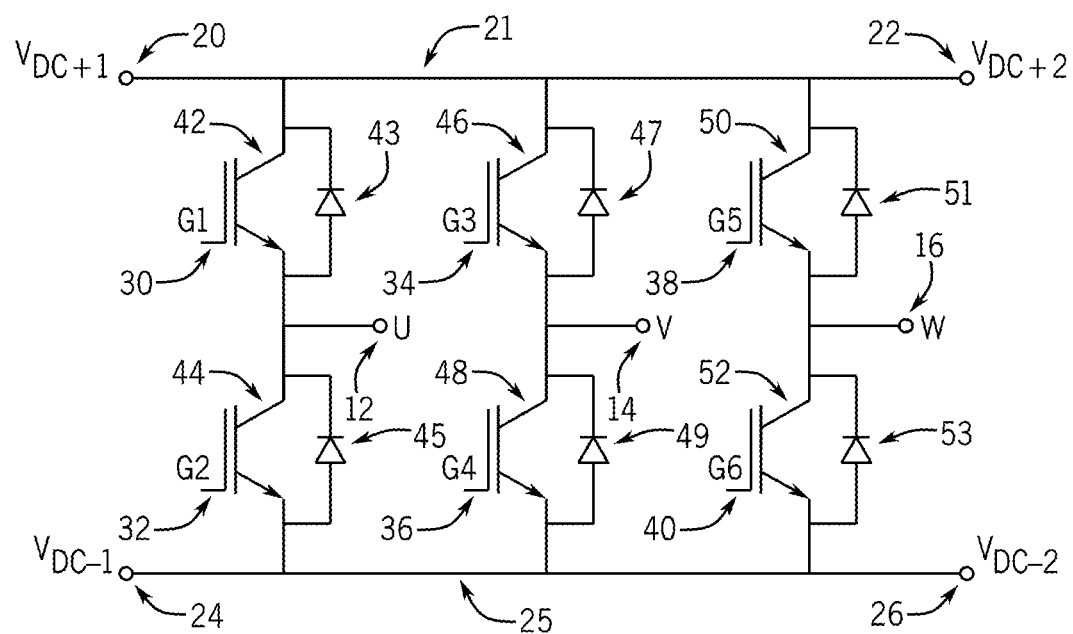
FIG. 3 is a schematic representation of the power semiconductor module of FIG. 1.

With reference then to FIGS. 1 and 2, the illustrated power semiconductor module 10 includes three output terminal blocks. A first output terminal block 12 conducts power for a "U" phase, a second output terminal block 14 conducts power for a "V" phase, and a third output terminal block 16 conducts power for a "W" phase. As illustrated, each output terminal block 12, 14, 16 includes three terminals. Each terminal is connected to a common conductor within the power semiconductor module 10 and is configured to conduct current in parallel from the module. The power semiconductor module 10 also includes a first positive DC bus terminal block ($V_{DC+1}$) 20 and a second positive DC bus terminal block ($V_{DC+2}$) 22. As seen in FIG. 3, a positive DC bus rail 21 connects the first positive DC bus terminal block ($V_{DC+1}$) 20 and the second positive DC bus terminal block ($V_{DC+2}$) 22 within the power semiconductor module 10. The configuration allows for multiple power semiconductor modules 10 to be connected in series to a shared DC bus. Similarly, the power semiconductor module 10 includes a first negative DC bus terminal block ($V_{DC-1}$) 24 and a second negative DC bus terminal block ($V_{DC-2}$) 26. As seen in FIG. 3, a negative DC bus rail 25 connects the first negative DC bus terminal block ($V_{DC-1}$) 24 and the second negative DC bus terminal block ($V_{DC-2}$) 26 within the power semiconductor module 10. Each of the positive and negative terminal blocks include three terminals connected to a common conductor within the power semiconductor module 10.

The power semiconductor module 10 also includes inputs configured to receive gating signals to control operation of the power semiconductor switches, or switching elements, within the module. A first input terminal block 30 is configured to receive a first gating signal (G1), a second input terminal block 32 is configured to receive a second gating signal (G2), a third input terminal block 34 is configured to receive a third gating signal (G3), a fourth input terminal block 36 is configured to receive a fourth gating signal (G4), a fifth input terminal block 38 is configured to receive a fifth gating signal (G5), and a sixth input terminal block 40 is configured to receive a sixth gating signal (G2). Each gating signal is selectively enabled and, in turn, selectively enables the switching element to which it is connected.

Turning next to FIG. 3, a schematic representation of the switching elements and their corresponding anti-parallel diodes in the exemplary power semiconductor module 10 is shown. Each output phase includes a pair of switching elements where a first switching element is connected between the positive DC bus rail 21 and the output and a second switching element is connected between the negative DC bus rail 25 and the output. The "U" phase includes a first power semiconductor switch 42, illustrated as an Insulated Gate Bipolar Transistors (IGBT), with a first diode 43 connected in an anti-parallel connection across the IGBT. The first power semiconductor switch 42 and first diode 43 are connected between the positive DC bus rail 21 and the "U" phase output terminal block 12. The "U" phase also includes a second power semiconductor switch 44, illustrated as an IGBT, with a second diode 45 connected in an anti-parallel connection across the IGBT. The second power semiconductor switch 44 and second diode 45 are connected between the negative DC bus rail 25 and the "U" phase output terminal block 12. The "V" phase includes a third power semiconductor switch 46, again illustrated as an IGBT, with a third diode 47 connected in an anti-parallel connection across the IGBT. The third power semiconductor switch 46 and third diode 47 are connected between the positive DC bus rail 21 and the "V" phase output terminal block 14. The "V" phase also includes a fourth power semiconductor switch 48, illustrated as an IGBT, with a fourth diode 49 connected in an anti-parallel connection across the IGBT. The fourth power semiconductor switch 48 and fourth diode 49 are connected between the negative DC bus rail 25 and the "V" phase output terminal block 14. The "W" phase includes a fifth power semiconductor switch 50, illustrated as an IGBT, with a fifth diode 51 connected in an anti-parallel connection across the IGBT. The fifth power semiconductor switch 50 and fifth diode 51 are connected between the positive DC bus rail 21 and the "W" phase output terminal block 16. The "W" phase also includes a sixth power semiconductor switch 52, illustrated as an IGBT, with a sixth diode 53 connected in an anti-parallel connection across the IGBT. The sixth power semiconductor switch 52 and sixth diode 53 are connected between the negative DC bus rail 25 and the "W" phase output terminal block 12. Although the illustrated power semiconductor module 10 is illustrated with Insulated Gate Bipolar Transistors (IGBTs), it is contemplated that the integrated current sensor disclosed herein may be applied to other power semi-conductor devices including, but not limited to, Metal-Oxide-Semiconductor Field Effect Transistors (MOSFETs), Bipolar-Junction Transistors (BJTs), and thyristors.

Turning again to FIG. 2, wire bonding is used to establish interconnections between a majority of the power semiconductor switches, diodes, terminal blocks and direct copper bonded (DCB) substrates. A first set of bonding wires 23 is identified as being connected between one of the copper substrates forming the positive DC bus rail 21 and the second positive DC bus terminal block ($V_{DC+2}$) 22, and a second set of bonding wires 27 is identified as being connected between one of the copper substrates forming the negative DC bus rail 25 and the second negative DC bus terminal block ($V_{DC-2}$) 26. The first and second set of bonding wires are identified as exemplary sets and are not intended to be limiting. It is observed that many sets of bonding wires are illustrated in FIG. 2 and the following discussion is applicable to each set. Bonding wires are typically uninsulated conductors formed, for example, from aluminum, copper, silver, or gold. The diameter of each wire is small such that the current conducting capacity of each wire is typically less than the rating for the power semiconductor module 10. Consequently, multiple bonding wires are connected in parallel between connections such that the sum of the current conducting capacity of the multiple wires is sufficient to conduct the rated capacity of the module. The bonding wires are held apart from each other and protected by a silicone gel 29 (see FIG. 1) injected over the components during assembly of the module 10, which forms, at least in part, the housing of the power semiconductor module 10. A resin case 31 mounted to a heatsink 11 further define the housing and includes a recessed portion within which the power electronic components, interconnections and silicone gel 29 is received.

In some embodiments of the invention, a leadframe is provided to establish an interconnection between at least one of the terminal blocks and a DCB substrate. As illustrated in FIG. 2, three leadframes 60, 62, 64 are provided within the power semiconductor module 10 to establish electrical connections with each of the output terminals 12, 14, 16. The leadframes 60, 62, 64 are each sized with a cross-sectional area of sufficient size to conduct the rated current of the output phase. As a result, a single leadframe conductor may replace multiple bonding wires that would otherwise be required for the connection. As will be discussed in more detail below, each leadframe 60, 62, 64 is designed to minimize coupling of currents within the phase and to provide at least one region along the leadframe having a consistent amplitude of magnetic field generated as a result of frequency conducted within the leadframe across a broad range of frequencies.

Figure 5:
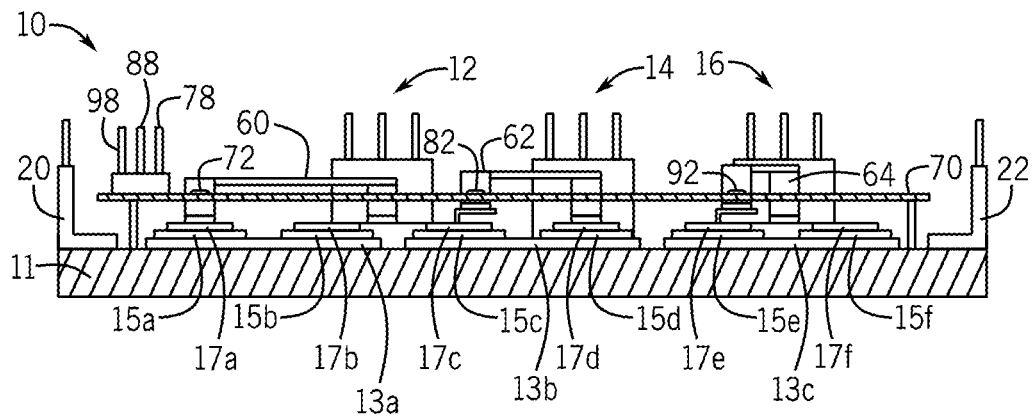
FIG. 5 is a sectional view taken at 5-5 in FIG. 4.

With reference to FIG. 5, exemplary construction of a DCB substrate is illustrated. The DCB substrate includes a heatsink 11, an electrical isolation substrate 13, and a conductive substrate 15. The electrical isolation substrate 13 may be, for example, a ceramic substrate or an epoxy-based dielectric that is mounted to the heatsink 11. The conductive substrate 15 may be made of copper and is mounted to the electrical isolation substrate 13. Separate conductive pads may be defined in the conductive substrate 15 by laser or chemical etching. Optionally, the conductive substrate 15 may include multiple preformed pads that are positioned on and mounted to the electrical isolation substrate 13. The power semiconductor devices 17 are included in packages that are, in turn, mounted to the conductive substrate 15.

According to the illustrated embodiment, each phase of the power semiconductor module 10 includes a separate electrical isolation substrate 13 mounted to the heatsink 11. The "U" phase includes a first electrical isolation substrate 13a, the "V" phase includes a second electrical isolation substrate 13b, and the "W" phase includes a third electrical isolation substrate 13c. Two copper pads are shown for each phase, where each copper pad includes one pair of the IGBTs and anti-parallel connected diodes. A first copper pad 15a and a second copper pad 15b are mounted to the "U" phase electrical isolation substrate 13a, and a first power semiconductor device 17a and a second power semiconductor device 17b are shown in the sectional view. A third copper pad 15c and a fourth copper pad 15d are mounted to the "V" phase electrical isolation substrate 13b, and a third power semiconductor device 17c and a fourth power semiconductor device 17d are shown in the sectional view. A fifth copper pad 15e and a sixth copper pad 15f are mounted to the "W" phase electrical isolation substrate 13c, and a fifth power semiconductor device 17e and a sixth power semiconductor device 17f are shown in the sectional view. Each power semiconductor device 17a-17f corresponds to one of the devices (i.e., the IGBT or the diode) located on the corresponding copper pad 15a-15f.

Figure 4:
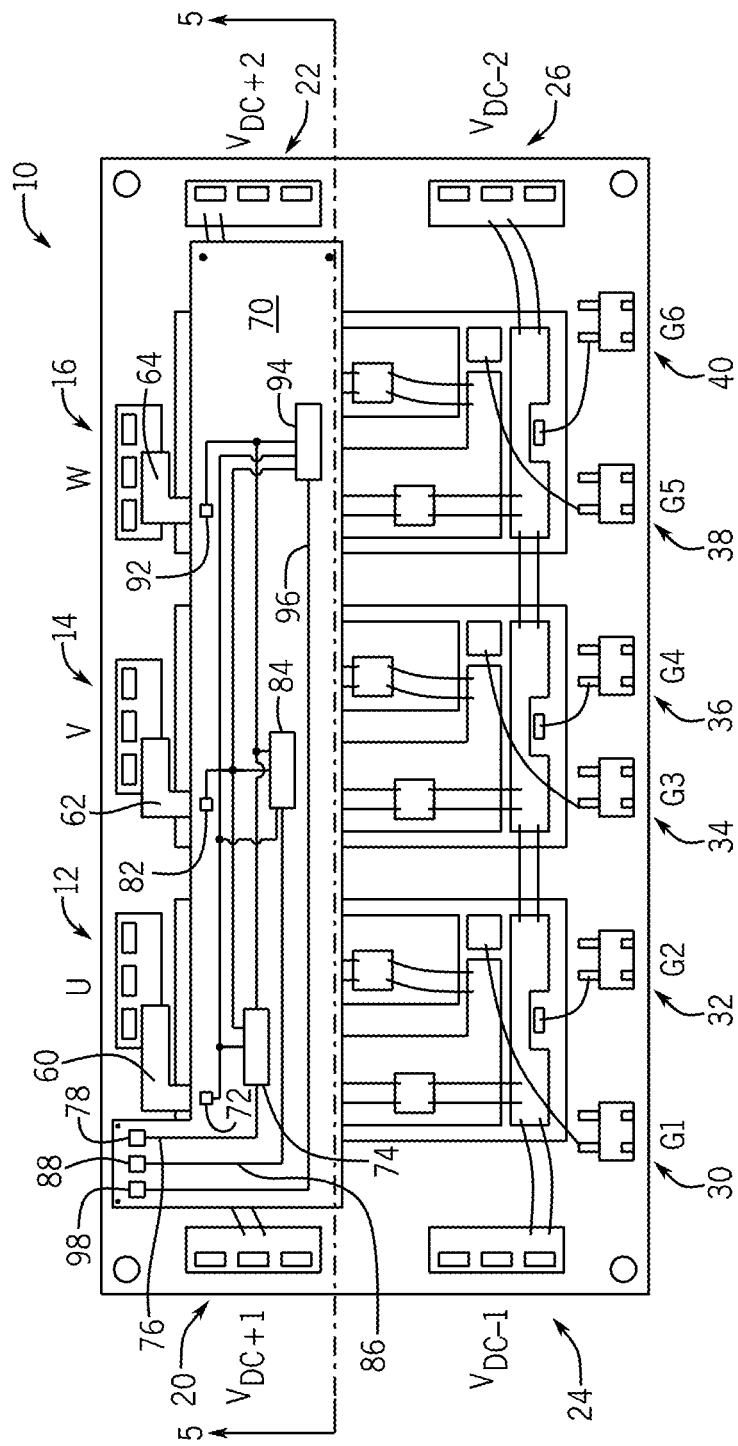
FIG. 4 a top schematic view of the power semiconductor module of FIG. 1 with an exemplary decoupling circuit board included.
Figure 23:
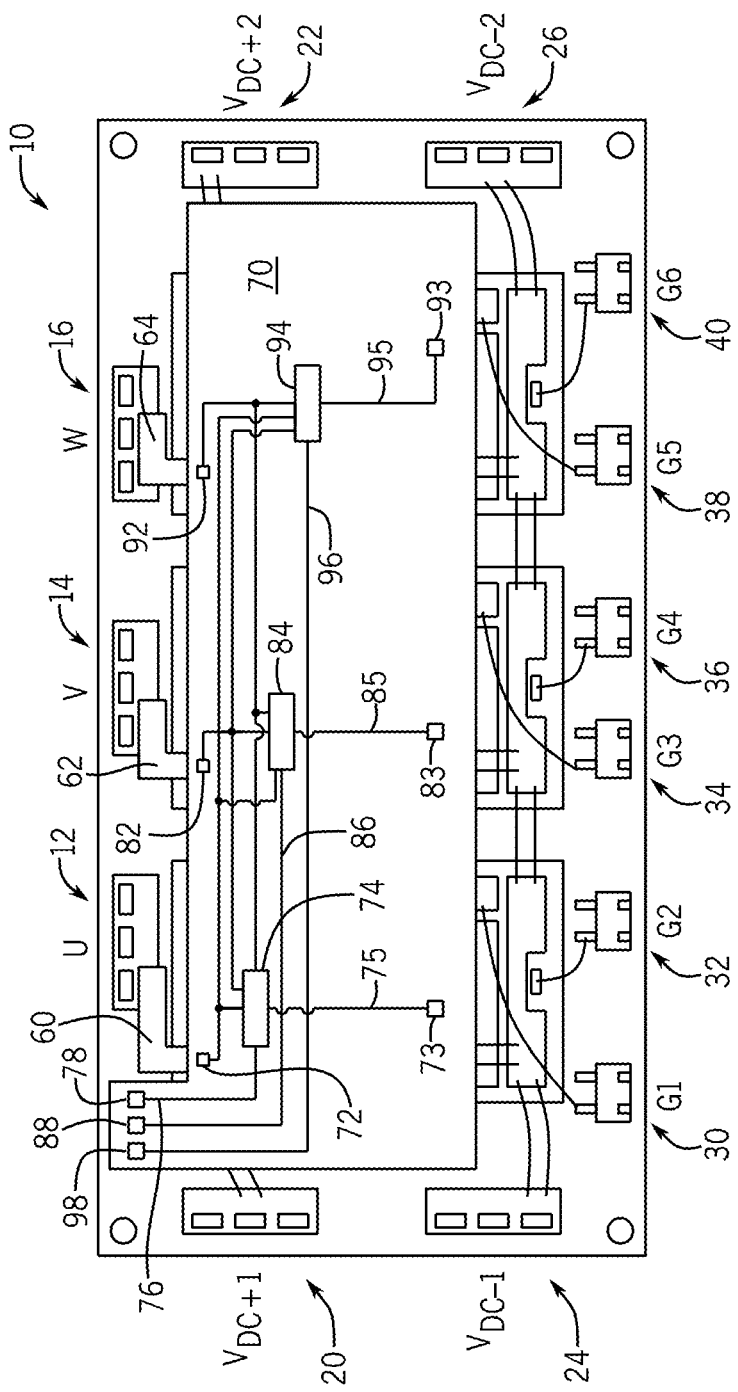
FIG. 23 a top schematic view of the power semiconductor module of FIG. 1 with another exemplary decoupling circuit board included.

Turning next to FIGS. 4 and 5, a magnetic field detector and a decoupling circuit are included for each output phase of the power semiconductor module 10. According to the illustrated embodiment, a circuit board 70 may be included within the power semiconductor module 10 on which the magnetic field detectors and the decoupling circuits are mounted. A first magnetic field detector 72 and a first decoupling circuit 74 are provided for the "U" phase output. The first magnetic field detector 72 is mounted on a top surface of the circuit board 70 opposite of a location where the leadframe 60 for the "U" phase passes beneath the circuit board 70. The magnetic field detector 72 is oriented on the circuit board 70 such that its axis of sensitivity detects a magnetic field generated by current flowing through the "U" phase leadframe 60. The output of the first magnetic field detector 72 is provided as an input to the first decoupling circuit 74 and to a second and third decoupling circuit 84, 94. The first decoupling circuit 74 is configured to decouple intra-phase and/or inter-phase currents within the power semiconductor module 10 that are also detected by the first magnetic field detector 72. If intra-phase currents are to be decoupled, an additional field detector 73 (see FIG. 23) is located above another location within the "U" phase at which magnetic fields are detectable as a result of the current flowing through the "U" phase leadframe 60 and a second current flowing within the "U" phase to be decoupled. A signal 75 corresponding to the magnetic field detected by the additional field detector 73 is provided to the first decoupling circuit 74. The first decoupling circuit 74 outputs a signal 76 corresponding to the measured current in the "U" phase leadframe 60, where the signal 76 is output at a terminal 78 for the power semiconductor module 10.

A second magnetic field detector 82 and a second decoupling circuit 84 are provided for the "V" phase output. The second magnetic field detector 82 is mounted on a top surface of the circuit board 70 opposite of a location where the leadframe 62 for the "V" phase passes beneath the circuit board 70. The magnetic field detector 82 is oriented on the circuit board 70 such that its axis of sensitivity detects a magnetic field generated by current flowing through the "V" phase leadframe 62. The output of the second magnetic field detector 82 is provided as an input to the second decoupling circuit 84 and to the first and third decoupling circuits 74, 94. The second decoupling circuit 84 is configured to decouple intra-phase and/or inter-phase currents within the power semiconductor module 10 that are also detected by the second magnetic field detector 82. If intra-phase currents are to be decoupled, an additional field detector 83 (see FIG. 23) is located above another location within the "V" phase at which magnetic fields are detectable as a result of the current flowing through the "V" phase leadframe 62 and a second current flowing within the "V" phase to be decoupled. A signal 85 corresponding to the magnetic field detected by the additional field detector 83 is provided to the second decoupling circuit 84. The second decoupling circuit 84 outputs a signal 86 corresponding to the measured current in the "V" phase leadframe 62, where the signal 86 is output at a terminal 88 for the power semiconductor module 10.

A third magnetic field detector 92 and a third decoupling circuit 94 are provided for the "W" phase output. The third magnetic field detector 92 is mounted on a top surface of the circuit board 70 opposite of a location where the leadframe 64 for the "W" phase passes beneath the circuit board 70. The third magnetic field detector 92 is oriented on the circuit board 70 such that its axis of sensitivity detects a magnetic field generated by current flowing through the "W" phase leadframe 64. The output of the third magnetic field detector 92 is provided as an input to the third decoupling circuit 94 and to the first and second decoupling circuits 74, 84. The third decoupling circuit 94 is configured to decouple intra-phase and/or inter-phase currents within the power semiconductor module 10 that are also detected by the third magnetic field detector 92. If intra-phase currents are to be decoupled, an additional field detector 93 (see FIG. 23) is located above another location within the "W" phase at which magnetic fields are detectable as a result of the current flowing through the "W" phase leadframe 64 and a second current flowing within the "W" phase to be decoupled. A signal 95 corresponding to the magnetic field detected by the additional field detector 93 is provided to the third decoupling circuit 94. The third decoupling circuit 94 outputs a signal 96 corresponding to the measured current in the "W" phase leadframe 64, where the signal 96 is output at a terminal 98 for the power semiconductor module 10. The decoupling circuits 74, 84, 94 will be discussed in more detail below.

According to one embodiment of the invention, the magnetic field detectors are magneto resistive devices. These devices include resistors that have a changing resistance value as a function of the presence of a magnetic field. Magneto resistive devices may be implemented in a single integrated circuit (IC) device and do not require a ferromagnetic core to detect the magnetic field. Magneto resistive devices are also electrically and galvanically isolated from the conductor in which they are detecting a current. Magneto resistive devices include Anisotropic Magneto Resistance (AMR) devices, Giant Magneto Resistance (GMR) devices, and Tunnel Magneto Resistance (TMR) devices. In the exemplary embodiment, a GMR detector is selected for each of the magnetic field detectors 72, 82, 92.

Figure 6:
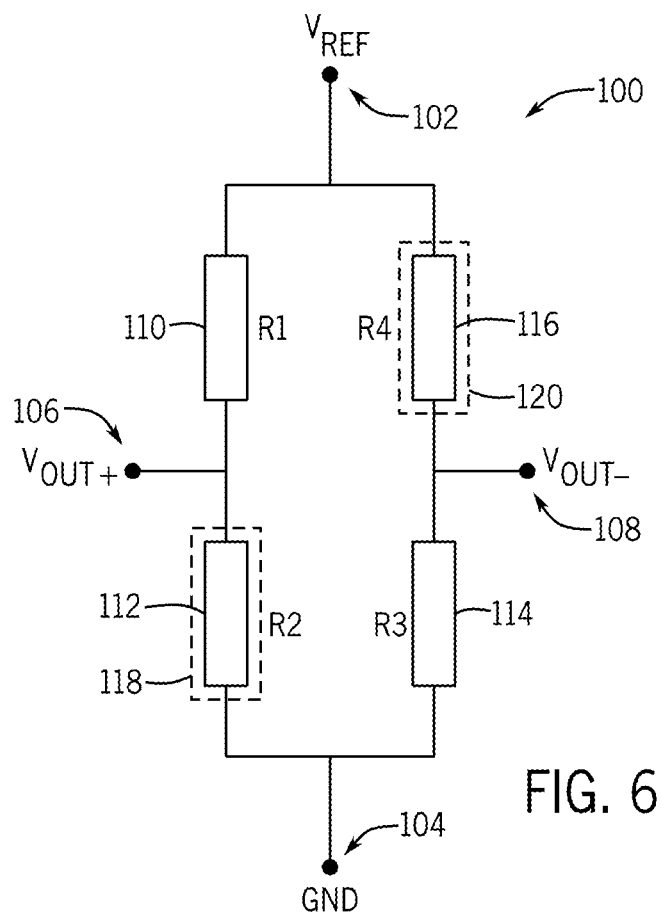
FIG. 6 is a schematic view of one embodiment of a point field detector for use with the present invention.

Turning next to FIG. 6, an exemplary GMR detector 100 that may be selected for each of the magnetic field detectors 72, 82, 92 is illustrated. The GMR detector 100 includes four resistors (R1-R4), where the resistance value of each resistor varies with the application of a magnetic field. The resistors (R1-R4) are connected within a single IC device in a wheatstone bridge configuration. The first resistor (R1) 110 is connected between a reference voltage ($V_{REF}$) 102 present at one terminal of the device and a positive output terminal ($V_{OUT+}$) 106. The second resistor (R2) 112 is connected between the positive output terminal ($V_{OUT+}$) 106 and a ground potential (GND) 104 present at another terminal of the device. The third resistor (R3) 114 is connected between the ground potential (GND) 104 and a negative output terminal ($V_{OUT-}$) 108. The fourth resistor (R4) 116 is connected between the negative output terminal ($V_{OUT-}$) 108 and the reference voltage ($V_{REF}$) 102. The second and fourth resistors 112, 116 each include a shield 118, 120 around the resistor to prevent the magnetic field from influencing the value of these resistors. Thus, when a magnetic field is applied to the GMR, only the values of the first and third resistors 110, 114 change as a function of the strength of the magnetic field observed. The output voltage as measured between the positive output terminal ($V_{OUT+}$) 106 and the negative output terminal ($V_{OUT-}$) 108 will change as a function of the changing values of the first and third resistors 110, 114. Thus, the strength of the magnetic field present at the GMR detector 100 is determined by monitoring the output voltage from the GMR.

In operation, one or more magnetic field detectors are used to determine a current present at an output terminal of the power semiconductor module 10. A leadframe 60, 62, or 64 may be provided as an electrical conductor through which the current is conducted to the output terminal. The leadframe terminal has a cross-sectional area of sufficient size to conduct the rated current of the output terminal. As a result, all of the current output from the terminal flows through a single conductor, which is in contrast to the multiple conductors used for wire bonding. Further, the cross-sectional area of the leadframe is sufficient to maintain a defined spatial geometry. As used herein, a defined spatial geometry indicates the leadframe has a fixed shape when subject to normal forces asserted on the leadframe, for example, during installation and operation. The spatial geometries of the leadframes 60, 62, 64 are configured to maintain a minimum distance between other conduction paths within the power semiconductor module 10 to reduce cross-coupling with other conductors. According to one embodiment of the invention, the minimum distance is at least 7 mm. Preferably, the minimum distance is at least 10 mm. The leadframes are further designed to minimize introduction of additional inductance into the commutation path between the switching elements and the terminals of the power semiconductor module 10. As a result, the leadframes include surfaces connected at orthogonal relationships to each other.

An exemplary set of electrical conductors 150, 170, and 190, which may be used as leadframes in a three-phase power module, are illustrated in FIGS. 8-19. Each leadframe 150, 170, 190 may be installed between a conductive substrate of the DCB module and an output terminal block for the power module. With reference first to FIGS. 8-11, a first electrical conductor 150 has a first foot 152, or first end, that is planar and provides a mounting surface to be soldered to a first conductive substrate of the DCB module. Using a horizontal reference for the conductive substrate, a first leg 154 extends upward from and orthogonal to the first foot 152. The first leg 154 provides a desired clearance from the first conductive substrate and connects to a first horizontal plate 156 of the first electrical conductor 150. The first horizontal plate 156 extends orthogonally to the first leg 154 and generally parallel to the conductive substrate toward the side of the power module. The first electrical conductor 150 then includes a second leg 158 extending upward from and orthogonal to the first horizontal plate 156. The height of the first electrical conductor 150 minimizes cross-coupling between conductive surfaces on the DCB module. A bridging plate 160 extends in a horizontal direction between and orthogonal to the second leg 158 and a third leg 162. The bridging plate 160 extends generally parallel to the side wall of the power module where the second leg 158 joins a first side 161 of the bridging plate 160 at a first end 165 and the third leg 162 joins a second side 163 of the bridging plate 160 at a second end 167. The second side 163 is opposite the first side 161 and the second end 167 is opposite the first end 165. The length of the bridging plate 160 is preferably at least equal to the sum of the widths of the second leg 158 and the third leg 162. The third leg 162 extends downward from and orthogonal to the bridging plate 160 a sufficient distance that a second foot 164, or second end, mounted to the third leg 162 may be mounted to a first terminal block. It is contemplated that the terminal block may include a conductive trace or conductive pad electrically connected to the terminal block to which the second foot 164 may be soldered. Thus, the first electrical conductor 150 establishes an electrical connection between a first conductive substrate of the DCB module and a first output terminal block for the power module.

As discussed above, the magnetic field detector 72 is oriented on the circuit board 70 to detect the magnetic field generated by current flowing through the first electrical conductor 150. When a current flows through the first electrical conductor 150, a magnetic field is generated for each segment of the first electrical conductor 150 described above. The magnetic field detector 72 is oriented to primarily detect the magnetic field generated by the second leg 158 and the third leg 162. Because each of the other segments (i.e., the first foot 152, the first leg 154, the first horizontal plate 156, the bridging plate 160, and the second foot 164) are oriented in a plane orthogonal to the planes in which the second leg 158 and third leg 162 are oriented, the magnetic fields generated by these segments provide little contribution to the magnetic field detected by the magnetic field detector 72. As a result, variations in the length of the other components have little effect on the magnetic field detected. For example, the lengths of the first horizontal plate 156 and the bridging plate 160 may vary, as will be observed with respect to the second and third electrical conductors 170, 190 discussed below, with little effect on the detected magnetic field. This allows the electrical conductors to vary in size according to the relative positions of the conductive substrate and terminal block to which each electrical conductor is connected.

With reference next to FIGS. 12-15, a second electrical conductor 170 has a first foot 172, or first end, that is planar and provides a mounting surface to be soldered to a second conductive substrate of the DCB module. Using a horizontal reference for the second conductive substrate, a first leg 174 of the second electrical conductor 170 extends upward from and orthogonal to the first foot 172. The first leg 174 provides a desired clearance from the second conductive substrate and connects to a first horizontal plate 176 of the second electrical conductor 170. The first horizontal plate 176 extends orthogonally to the first leg 174 and generally parallel to the conductive substrate toward the side of the power module. The second electrical conductor 170 then includes a second leg 178 extending upward from and orthogonal to the first horizontal plate 176. The height of the second electrical conductor 170 minimizes cross-coupling between conductive surfaces on the DCB module. A bridging plate 180 extends in a horizontal direction between and orthogonal to the second leg 178 and a third leg 182. The bridging plate 180 extends generally parallel to the side wall of the power module where the second leg 178 joins a first side 181 of the bridging plate 180 at a first end 185 and the third leg 182 joins a second side 183 of the bridging plate 180 at a second end 187. The second side 183 is opposite the first side 181 and the second end 187 is opposite the first end 185. The length of the bridging plate 180 is preferably at least equal to the sum of the widths of the second leg 178 and the third leg 182. In the illustrated example, the bridging plate 180 extends for a distance greater than the sum of the widths of the second leg 178 and the third leg 182 in order to span the distance between the second conductive substrate and the second output terminal block. The third leg 182 extends downward from and orthogonal to the bridging plate 180 a sufficient distance that a second foot 184, or second end, mounted to the third leg 182 may be mounted to the second terminal block. It is contemplated that the terminal block may include a conductive trace or conductive pad electrically connected to the terminal block to which the second foot 184 may be soldered. Thus, the second electrical conductor 170 establishes an electrical connection between a second conductive substrate of the DCB module and a second output terminal block for the power module.

With reference then to FIGS. 16-19, a third electrical conductor 190 has a first foot 192, or first end, that is planar and provides a mounting surface to be soldered to a third conductive substrate of the DCB module. Using a horizontal reference for the third conductive substrate, a first leg 194 of the third electrical conductor 190 extends upward from and orthogonal to the first foot 192. The first leg 194 provides a desired clearance from the third conductive substrate and connects to a first horizontal plate 196 of the third electrical conductor 190. The first horizontal plate 196 extends orthogonally to the first leg 194 and generally parallel to the conductive substrate toward the side of the power module. The third electrical conductor 190 then includes a second leg 198 extending upward from and orthogonal to the first horizontal plate 196. The height of the third electrical conductor 190 minimizes cross-coupling between conductive surfaces on the DCB module. A bridging plate 200 extends in a horizontal direction between and orthogonal to the second leg 198 and a third leg 202. The bridging plate 200 extends generally parallel to the side wall of the power module where the second leg 198 joins a first side 201 of the bridging plate 200 at a first end 205 and the third leg 202 joins a second side 203 of the bridging plate 200 at a second end 207. The second side 203 is opposite the first side 201 and the second end 207 is opposite the first end 205. The length of the bridging plate 200 is preferably at least equal to the sum of the widths of the second leg 198 and the third leg 202. In the illustrated example, the bridging plate 200 extends for a distance greater than the sum of the widths of the second leg 198 and the third leg 202 in order to span the distance between the third conductive substrate and the third output terminal block. The third leg 202 extends downward from and orthogonal to the bridging plate 200 a sufficient distance that a second foot 204, or second end, mounted to the third leg 202 may be mounted to the second terminal block. It is contemplated that the terminal block may include a conductive trace or conductive pad electrically connected to the terminal block to which the second foot 204 may be soldered. Thus, the second electrical conductor 170 establishes an electrical connection between a third conductive substrate of the DCB module and a third output terminal block for the power module.

Figure 20:
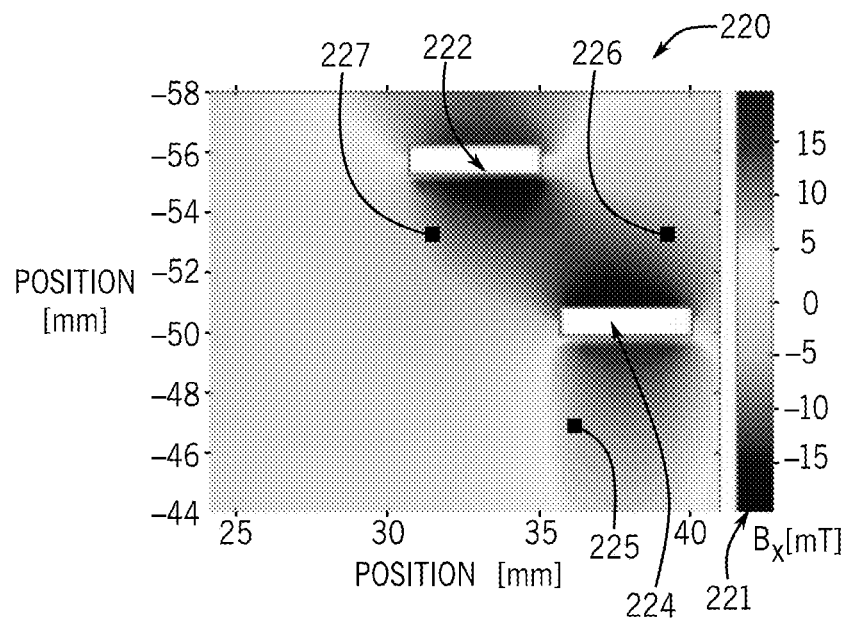
FIG. 20 is a graphical representation of finite element analysis of the strength of a magnetic field generated at a cross-section of the lead frame conductor of FIG. 8 with a DC current being conducted.
Figure 21:
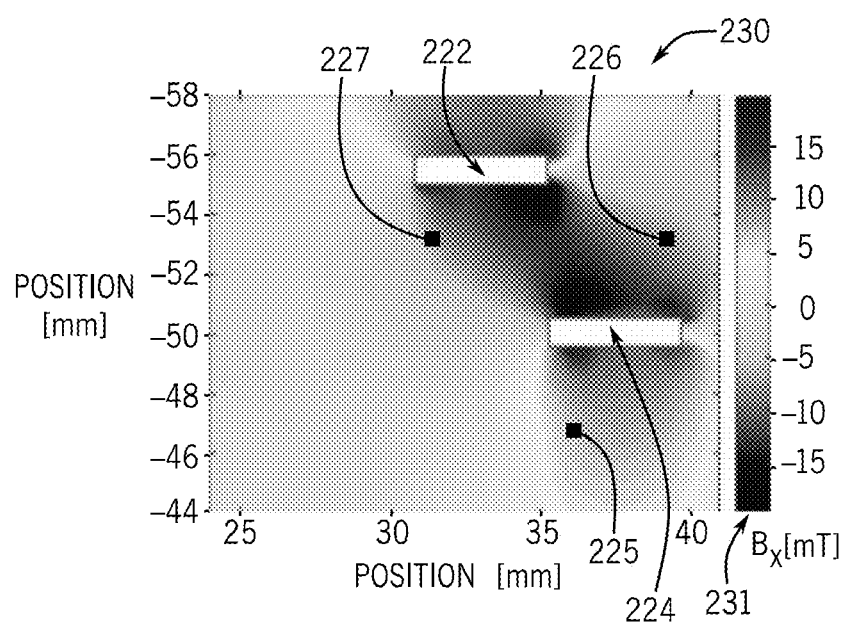
FIG. 21 is a graphical representation of finite element analysis of the strength of a magnetic field generated at the cross-section of FIG. 17 of the lead frame conductor of FIG. 8 with an AC current at 100 kHz being conducted.
Figure 22:
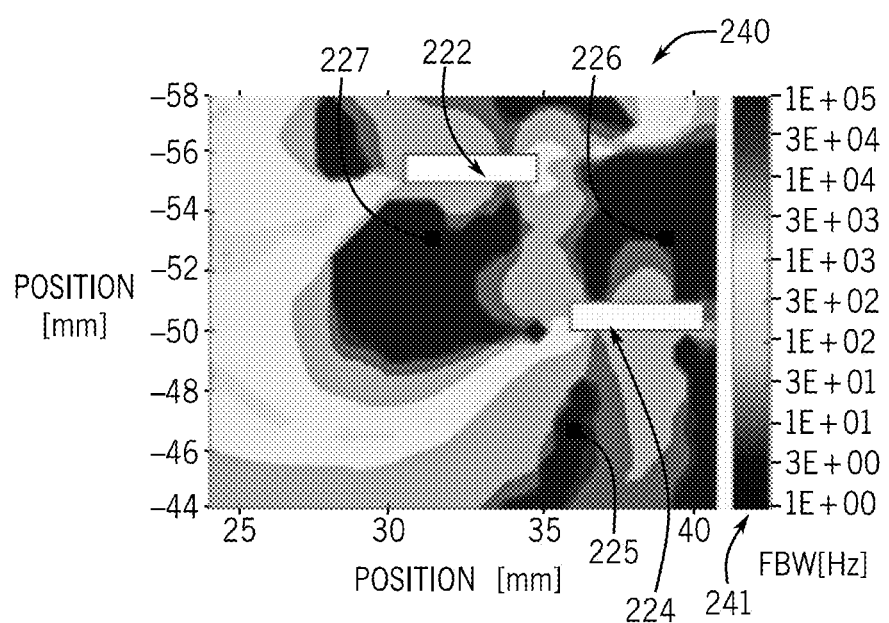
FIG. 22 is a graphical representation of finite element analysis of the flat bandwidth region for the cross-section of FIGS. 17 and 18 of the lead frame conductor of FIG. 8 for current conducted between 0 Hz and 100 kHz.

In order to achieve an accurate current measurement, the magnetic field detector should be placed at a location which will generate a consistent magnetic field over the expected frequency range for the current to be measured. Turning next to FIGS. 20-22, plots of finite element analysis performed on the first electrical conductor 150 are provided to demonstrate an exemplary process for selection of a mounting location for the magnetic field detector. The GMR detector 100 selected as the magnetic field detector is referred to as a point field detector, meaning the magnetic field at a particular point in space is measured. Operation of the GMR detector 100 will be discussed in more detail below.

The magnetic field measured by the GMR detector is generated by current flowing in the power semiconductor module. For the exemplary six-pack module 10, a measurement of the current flowing in each of the leadframes 60, 62, 64 is desired because the leadframes 60, 62, 64 are connected to the output terminals 12, 14, 16 of the module 10. It is known that current is distributed within a conductor differently for different frequencies of the current. This varying distribution of current is due, for example, to eddy currents and the skin effect in the conductor. At DC, or zero Hertz, the current is distributed throughout the conductor. As the frequency of the current increase, the current becomes distributed closer to the surface and to corners of the conductor. The resulting magnetic field generated by the current is, therefore, spatially distributed differently around the conductor as a result of the varying distribution of current within the conductor.

Figure 8:
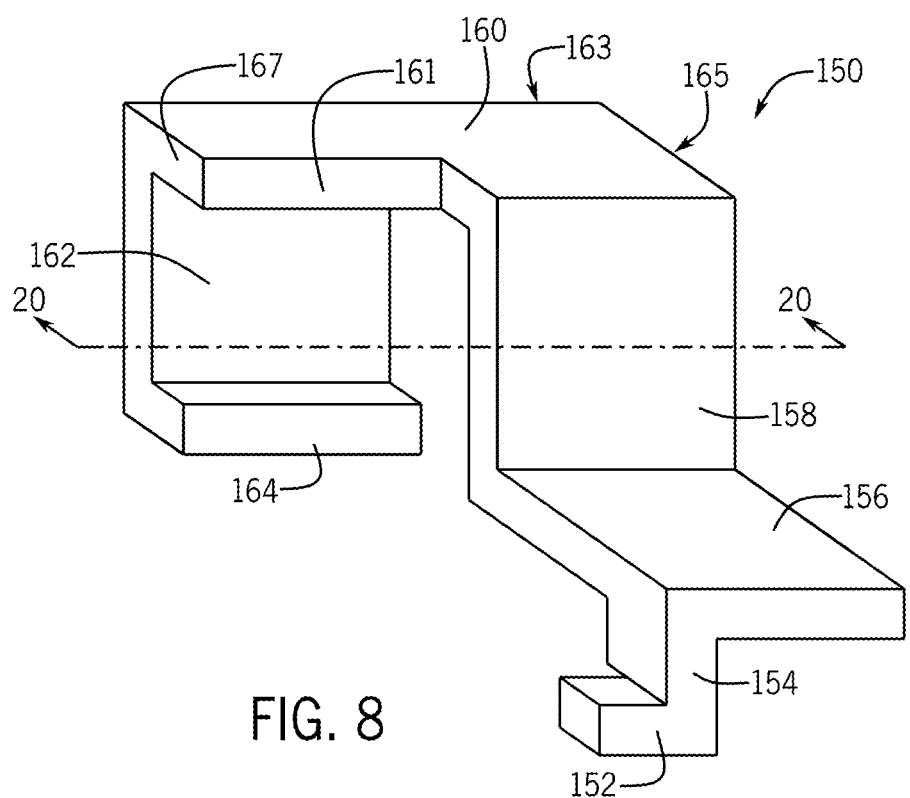
FIG. 8 is an isometric view of one embodiment of a lead frame conductor for use with the present invention.
Figure 9:
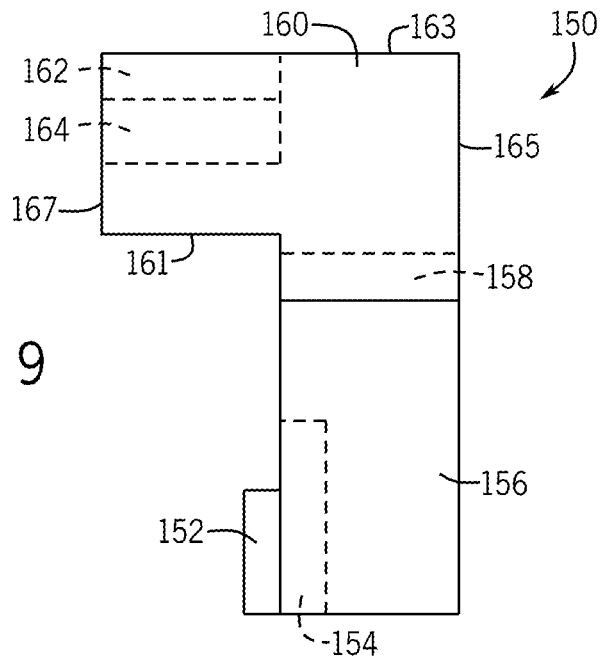
FIG. 9 is a top plan view of the lead frame of FIG. 8.
Figure 10:
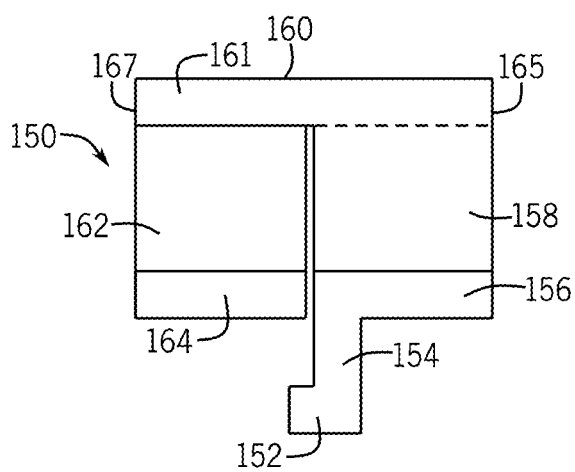
FIG. 10 is a front elevation view of the lead frame of FIG. 8.
Figure 11:
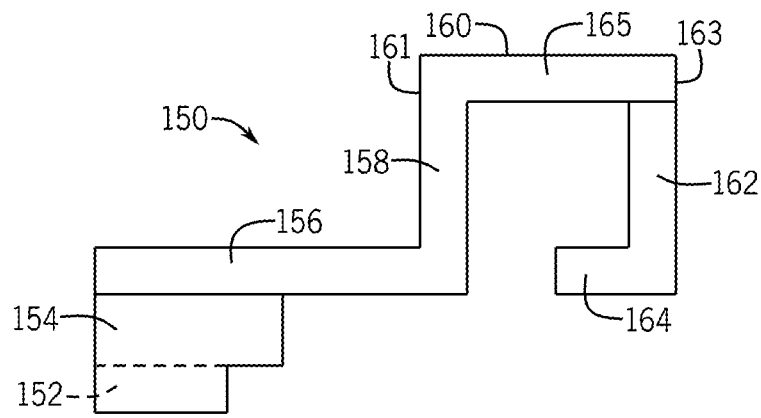
FIG. 11 is a right side elevation view of the lead frame of FIG. 8.
Figure 12:
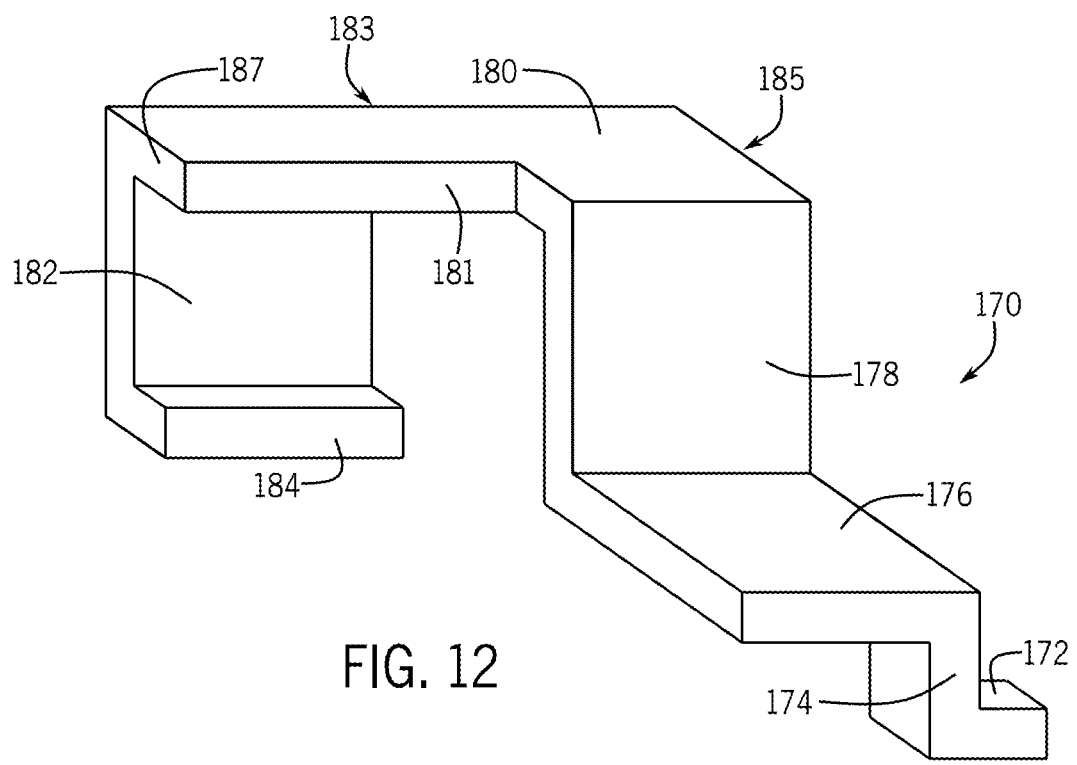
FIG. 12 is an isometric view of another embodiment of a lead frame conductor for use with the present invention.
Figure 13:
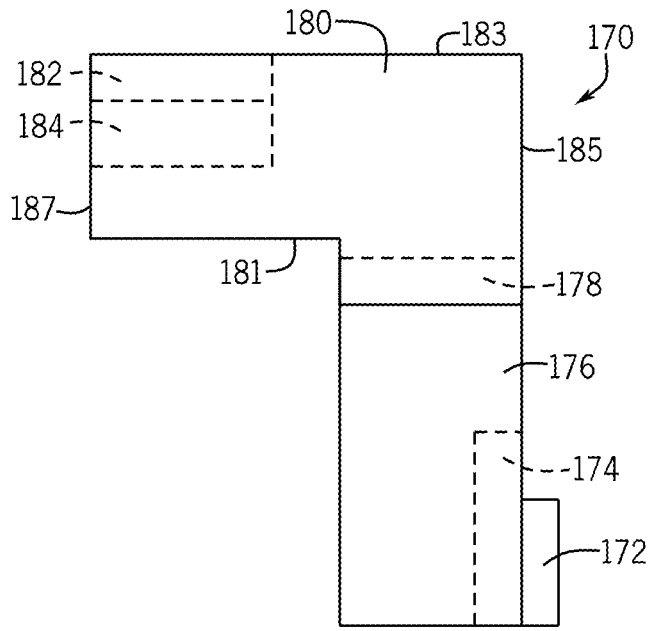
FIG. 13 is a top plan view of the lead frame of FIG. 12.
Figure 14:
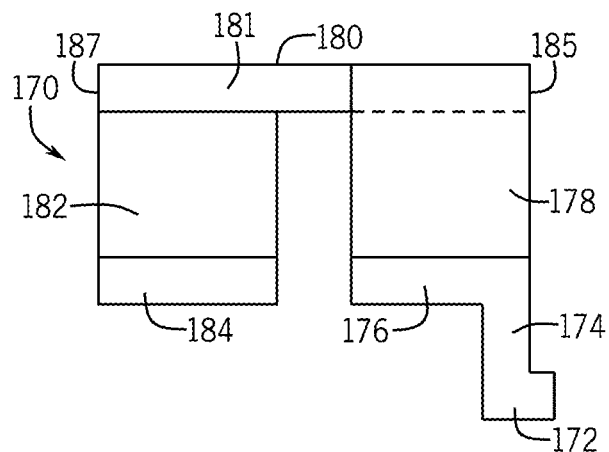
FIG. 14 is a front elevation view of the lead frame of FIG. 12.
Figure 15:
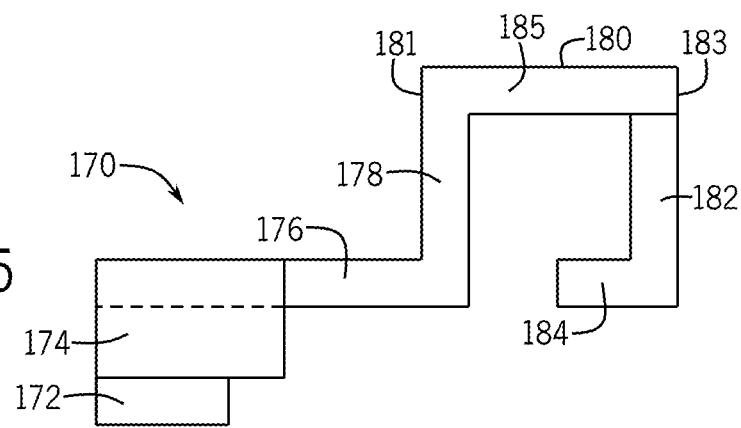
FIG. 15 is a right side elevation view of the lead frame of FIG. 12.
Figure 16:
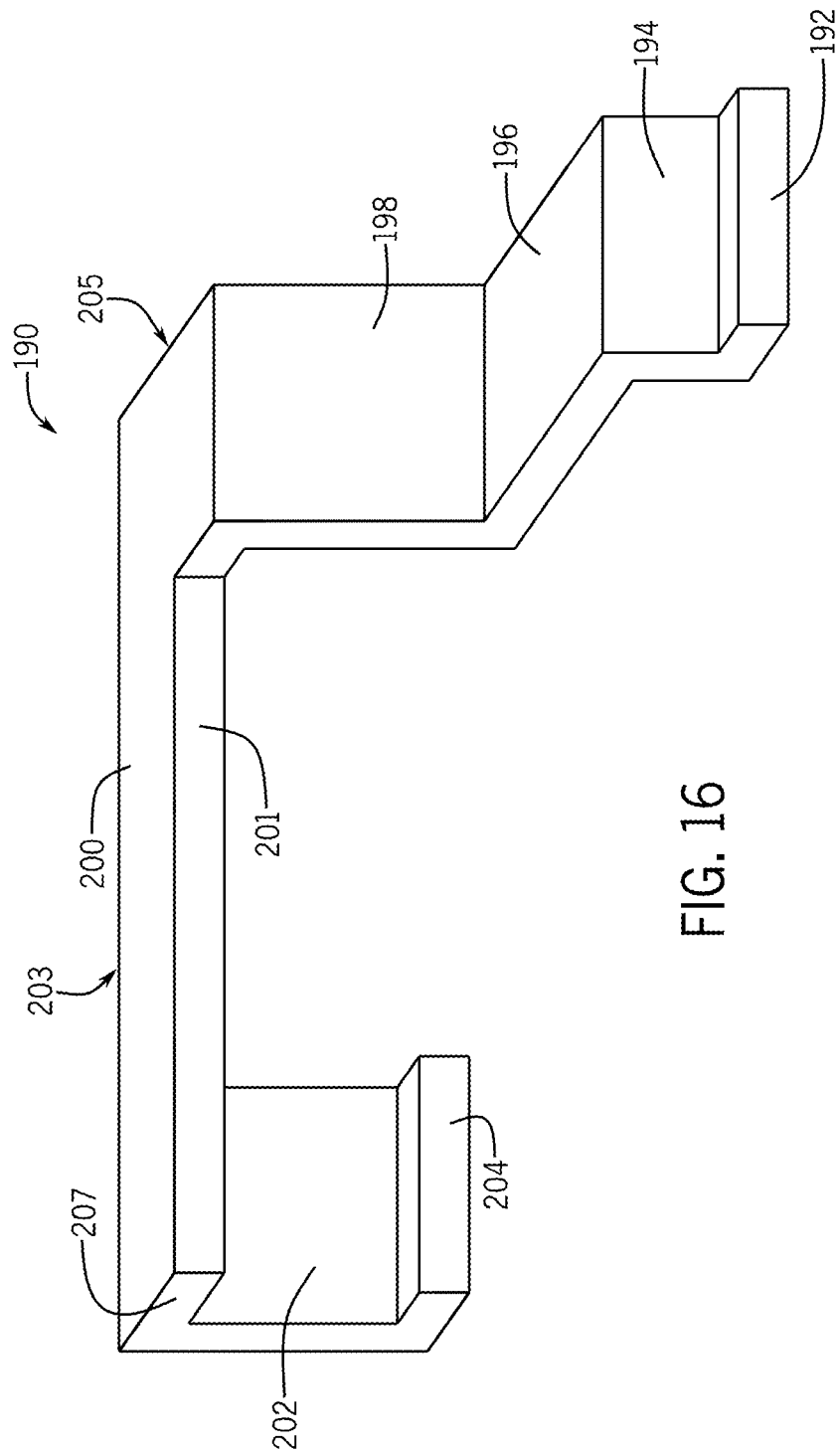
FIG. 16 is an isometric view of another embodiment of a lead frame conductor for use with the present invention.
Figure 17:
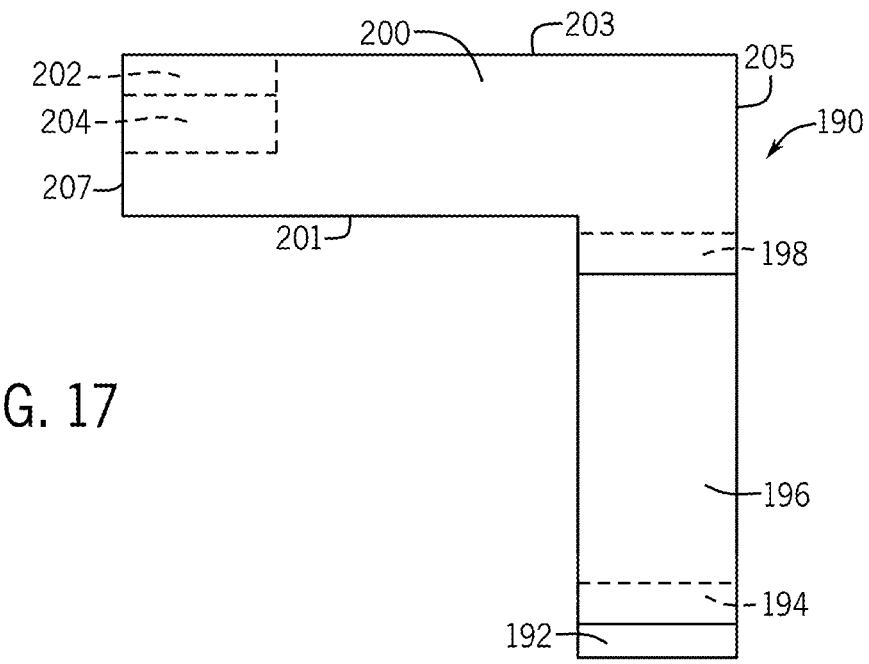
FIG. 17 is a top plan view of the lead frame of FIG. 16.
Figure 18:
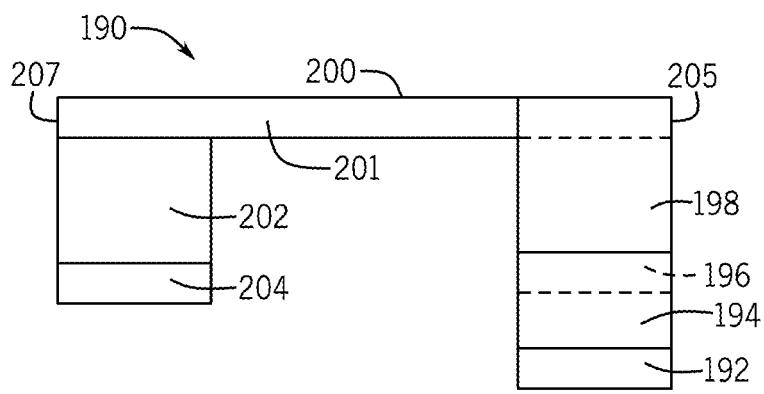
FIG. 18 is a front elevation view of the lead frame of FIG. 16.
Figure 19:
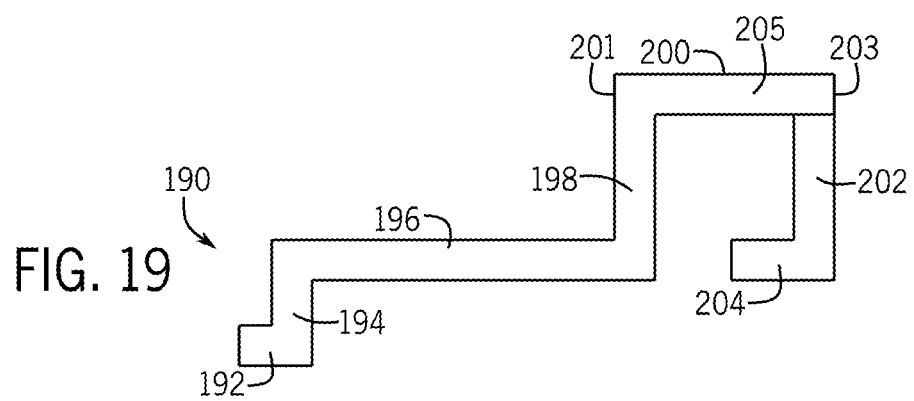
FIG. 19 is a right side elevation view of the lead frame of FIG. 16.

The metric used to identify the desired location for mounting the GMR detector 100 is referred to as a five percent flat bandwidth (5% FBW) region. The 5% FBW region is the range of frequencies of current over which the strength of the magnetic field deviates less than five percent from the strength of the magnetic field at DC, or zero Hertz, with a constant amplitude of current. In FIG. 20, a plot of the distribution of the magnetic field generated in a plane by a DC current conducted in the first electrical conductor 150 of FIG. 8 is shown. A sectional view of the first electrical conductor 150 taken at 20-20 in FIG. 8 results in a first section 222 and a second section 224 of the first electrical conductor 150. The first section 222 is a cross-section of the third leg 162, and the second section 224 is a cross-section of the second leg 158 taken just above the second foot 164 and the first horizontal plate 156, respectively. With reference to the scale 221 shown in FIG. 17, the strength of the magnetic field, in milliTeslas, is shown at various distances from each of the first and second sections 222, 224. Due to the operation of the GMR, as will be discussed below, it is desirable to select a location at which the amplitude of the magnetic field is between about 2 and 8 mT. The GMR provides a unidirectional output and, therefore, the polarity of the magnetic field may be either positive or negative. A first location 225, a second location 226, and a third location 227 that satisfy the criteria for conduction of a DC current are identified in FIG. 17.

FIG. 21 similarly shows a plot of the distribution of the magnetic field generated in a plane by a current conducted in the first electrical conductor 150 of FIG. 8 where the current is at 100 kHz. The sectional view of the first electrical conductor 150 taken at 20-20 in FIG. 8 is again shown for comparison with respect to the magnetic field generated at DC illustrated in FIG. 20. With reference to the scale 231 shown in FIG. 18, the strength of the magnetic field, in milliTeslas, is shown at various distances from each of the first and second sections 222, 224 for a 100 kHz current. The three locations 225, 226, 227 identified in FIG. 20 are again illustrated in FIG. 21. It is observed that the amplitude of the magnetic field at these locations with a 100 kHz current is again between about 2 and 8 mT.

FIG. 22 provides a plot of the distribution of the 5% FBW regions in space with respect to each of the first and second sections 222, 224. With reference to the scale 241 shown in FIG. 22, the frequency range across which the region has a 5% FBW is illustrated. The three locations 225, 226, 227 identified in FIG. 20 are again illustrated in FIG. 22. It is observed that for each location, the frequency range of current across which that location maintains a normalized magnetic field strength within the 5% FBW deviation is at least 100 kHz. Thus, any of the three locations 225, 226, 227 satisfy the desired metric for placement of the GMR detector.

With reference again to FIG. 8 and FIG. 4, it is noted that the second location 226 and the third location 227 identified in FIGS. 20-22 are located in the region between the second leg 158 and the third leg 162 and under the bridging plate 160. As a result, physically locating a GMR detector within this region presents challenges. The first location 225 identified in FIGS. 20-22 is located in front of the second leg 158 and above the first horizontal plate 156. It is noted that the region provides easier access for mounting the GMR detector than the second or third locations and, in the illustrated embodiment, is selected as the region at which each GMR 72, 82, 92 is mounted with respect to the corresponding leadframe 60, 62, 64.

Figure 7:
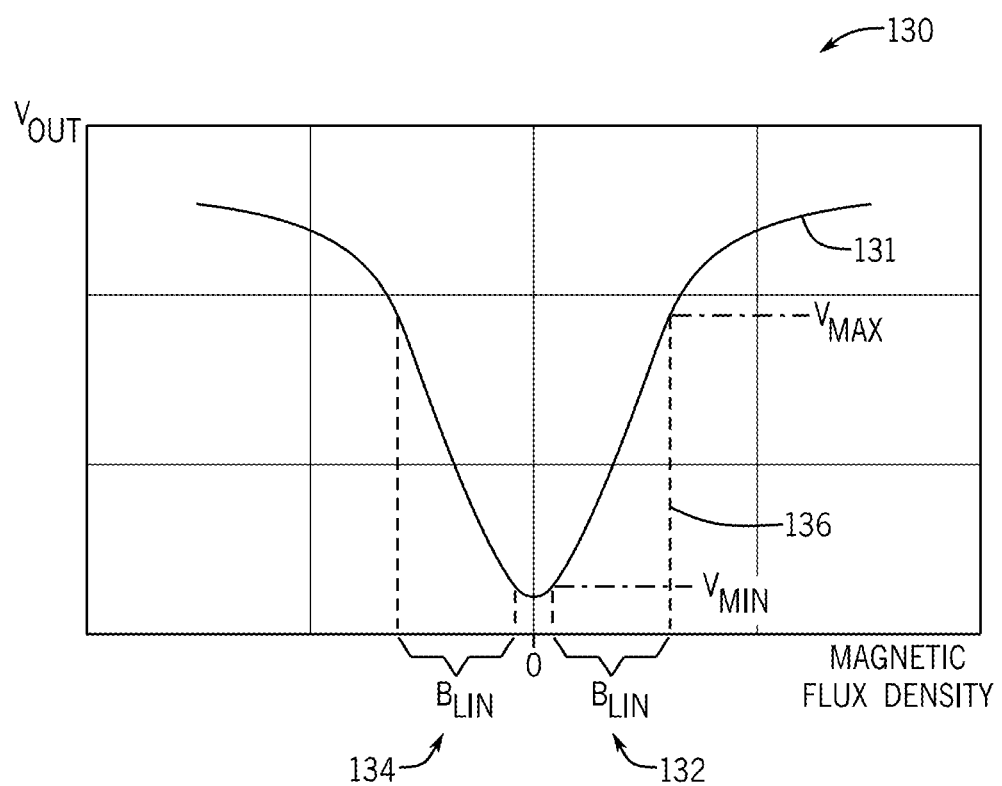
FIG. 7 is a graphical representation of the operating regions of the point field detector of FIG. 6.

Turning next to FIG. 7, operation of the exemplary GMR detector 100 of FIG. 6 is illustrated. The GMR detector 100 receives a reference voltage between the reference voltage ($V_{REF}$) 102 terminal and the ground potential (GND) 104 terminal. With no magnetic field applied to the GMR detector 100, a minimum output voltage ($V_{MIN}$) is present between the positive output terminal ($V_{OUT+}$) 106 and the negative output terminal ($V_{OUT-}$) 108. As the amplitude of the magnetic field increase, either in a positive or negative polarity, the values of the first and third resistors 110, 114 change, causing the value of the output voltage between the positive output terminal ($V_{OUT+}$) 106 and the negative output terminal ($V_{OUT-}$) 108 to change. As shown in FIG. 7, a first linear operating region 132 exists for a magnetic field having a positive polarity, and a second linear operating region 134 exists for a magnetic field having a negative polarity. The linear output region extends from about 2 mT to about 8 mT. As the strength of the detected field, therefore, increases between about 2 mT to about 8 mT, the output voltage between the positive output terminal ($V_{OUT+}$) 106 and the negative output terminal ($V_{OUT-}$) 108 linearly increases over the range 136 between the minimum output voltage ($V_{MIN}$) and a maximum output voltage ($V_{MAX}$).

In order to detect both a positive and a negative current flow through the leadframe 60, 62, 64 using just one of the linear operating regions of the GMR detector, a magnet is placed proximate the GMR detector 72, 82, 92. The magnet may be, for example, a permanent magnet and generates a constant magnetic field. The magnet is selected such that the output voltage output from the GMR detector with no current flowing in the leadframe is approximately at a midpoint between the minimum output voltage ($V_{MIN}$) and a maximum output voltage ($V_{MAX}$). The GMR detector is further selected such that the linear range of operation spans a range of magnetic fields about twice the expected magnetic field generated as a result of the maximum current expected to flow through the corresponding leadframe. In combination with the biasing magnet, the GMR detector can generate a signal corresponding to a magnetic field resulting from either a positive or negative polarity current up to a maximum expected amplitude while remaining within the linear range 136 of operation for the detector.

As shown in FIG. 4, the output of each GMR detector 72, 82, 92 is provided to a decoupling circuit 74, 84, 94. Although illustrated as separate decoupling circuits 74, 84, and 94, it is contemplated that the decoupling circuits may be implemented as a single decoupling circuit, where the input from each of the GMR detectors 72, 82, 92 are provided to the single circuit and separate signals corresponding to the measured currents in each phase are output from the decoupling circuit. As will be discussed further below, if separate decoupling circuits are provided, it is contemplated that one or more of the outputs of the GMR detectors 72, 82, 92 are provided to each of the decoupling circuits 74, 84, 94 to provide a measured value of current at an another location within the power module 10 to each decoupling circuit.

Despite the physical construction of the leadframes 60, 62, 64 to minimize cross-coupling with other conductors within the power module 10, some cross-coupling still exists. In particular, for a three-phase output, a portion of the output current for each phase generates a magnetic field observed, at least in part, by each of the leadframes. Therefore, to improve the accuracy of the measured current, it is desirable to provide decoupling of the inter-phase magnetic field coupling. The amount of coupling by magnetic fields generated from currents flowing in each phase may be expressed, for example, in the coupling matrix presented in Equation 1.

$$\frac{\mu}{2\pi}\begin{bmatrix} \frac{1}{a} & \frac{a}{a^2+b^2} & \frac{a}{a^2+4b^2} \\ \frac{a}{a^2+b^2} & \frac{1}{a} & \frac{a}{a^2+b^2} \\ \frac{a}{a^2+4b^2} & \frac{a}{a^2+b^2} & \frac{1}{a} \end{bmatrix}\begin{bmatrix} I_1 \\ I_2 \\ I_3 \end{bmatrix} = \begin{bmatrix} B_1 \\ B_2 \\ B_3 \end{bmatrix} \quad (1)$$

where:
$I_1$ is the current in the first leadframe,
$I_2$ is the current in the second leadframe,
$I_3$ is the current in the third leaframe,
$B_1$ is the amplitude of the magnetic field detected at the first GMR detector,
$B_2$ is the amplitude of the magnetic field detected at the second GMR detector,
$B_3$ is the amplitude of the magnetic field detected at the third GMR detector,
a is the distance between each leadframe and the corresponding GMR detector in a lateral direction, and
b is the distance between each leadframe and the corresponding GMR detector in a vertical direction.

Based on the coupling matrix presented in equation 1, a decoupling matrix is readily defined that decouples the portion of the magnetic field sensed at each of the GMR detectors that is generated by currents flowing in leadframes other than the leadframe next to which the GMR detector is mounted. The decoupling matrix is presented below in Equation 2.

$$\frac{2\pi}{\mu}\begin{bmatrix} \frac{1}{a} & \frac{a}{a^2+b^2} & \frac{a}{a^2+4b^2} \\ \frac{a}{a^2+b^2} & \frac{1}{a} & \frac{a}{a^2+b^2} \\ \frac{a}{a^2+4b^2} & \frac{a}{a^2+b^2} & \frac{1}{a} \end{bmatrix}^{-1}\begin{bmatrix} B_1 \\ B_2 \\ B_3 \end{bmatrix} = \begin{bmatrix} I_1 \\ I_2 \\ I_3 \end{bmatrix} \quad (2)$$

Using measured distances between each GMR detector 72, 82, 92 and the leadframes 60, 62, 62 within a power semiconductor module 10, the decoupling matrix may be reduced to a single linear equation for each of the measured currents. An exemplary embodiment is shown in Equation 3 below, where the decoupled current value for the second phase, $I_2$, is determined.

$$I_2 = 0.061 \cdot B_1 + 1.019 \cdot B_2 - 0.065 \cdot B_3 \quad (3)$$

As may be observed in Equation 3, the output signals of each GMR detector (i.e., $B_1$, $B_2$, $B_3$) are multiplied by gain terms and added or subtracted to each other. The multiplication and summation may be performed by a linear circuit including, for example, operational amplifiers with appropriate networks of resistors and/or capacitors to implement the gain terms for each equation. As a result, the measured signals may be processed quickly in analog format to decouple inter-phase coupled components. As may also be observed in Equation 3, the coefficient of the measured magnetic field ($B_2$) from the second GMR detector 82 corresponds to the largest component of the decoupled current ($I_2$). The coefficients of the other measured currents are significantly less indicating that the magnetic field detected by the second GMR detector 82 is primarily made up of the magnetic field generated by the current flowing in the second leadframe 62 with a minority of the detected field being made up of currents flowing in the other leadframes. Nevertheless, to provide an accurate measurement of the current ($I_2$) flowing in the leadframe, it is desirable to decouple the effects of the other currents within the power semiconductor module 10.

Although a theoretical model of the coupling may be determined by precise placement and measuring of the distances between each GMR detector and each leadframe, some error in the measurements and/or placement of devices may still occur during manufacturing. To facilitate manufacturing, it is desirable, therefore, to provide a decoupling circuit in which at least a portion of the component values for the elements used to determine gain coefficients may be adjusted during the manufacturing of the module. With the adjustable coefficients, the leadframes 60, 62, 64 may be mounted within the power semiconductor module 10 and the GMR detectors 72, 82, 92 may be mounted to the circuit board 70 using automated and/or manual manufacturing methods within predefined manufacturing tolerances, allowing for some fluctuation in the resulting distances that are used in the decoupling matrix.

In one embodiment, a portion of the resistive network may include laser trimmable resistors. The initial value of the resistors are selected such that a nominal value of the components corresponds to a nominal value of the coefficients required to decouple other components of the magnetic field. During assembly, each module may enter a test fixture in which the power semiconductor module 10 may be operated such that a sinusoidal waveform is output from each phase of the power semiconductor module 10. An external current sensor may measure the current output from each phase of the power semiconductor module to obtain a first set of measured values of the output current, and the GMR detectors may provide output signals based on the initial values of the circuit elements in the decoupling circuit to obtain a second set of measured values of the output current. A first phase of the first set of measured values is compared to a corresponding phase of the second set of measured values in order to determine whether adjustments to the component values in the decoupling circuit are required. If cross-coupling between phases is present, a phase offset between the first and second sets of measured values for corresponding phases will be present. For example, an initial comparison of the value of the current measured in the second phase between the first and second sets of measured values may indicates a phase difference between the two sets. Laser trimming may be performed on resistors within the resistive network that correspond to the coefficient for cross-coupling of the first phase with the second phase. As the resistor values are adjusted, the phase difference of the error between the two measured values will shift. The resistor values are adjusted until the phase of the error signal is aligned with the third phase. When the phase of the error signal is aligned with the third phase, the coefficients for the decoupling the first phase from the second phase are adjusted such that first phase is decoupled from the second phase. Laser trimming may then be performed on resistors within the resistive network that correspond to the coefficient for cross-coupling of the third phase with the second phase. As the resistor values are adjusted, the phase difference of the error between the two measured values will again shift. The resistor values are adjusted until the phase of the remaining error signal is aligned with the second phase. When the phase of the error signal is aligned with the second phase, the coefficients for the decoupling the third phase from the second phase are adjusted such that third phase is decoupled from the second phase. The laser trimming may be repeated for each phase, such that the linear decoupling circuit may be tuned for each power semiconductor module 10. The decoupling circuit will decouple the measured magnetic field generated as result of the current flowing in the monitored leadframe from the magnetic field generated as a result of current flowing in the other leadframes. It is contemplated that other test fixtures and other methods of trimming components to adjust coefficients may be implemented without deviating from the scope of the invention.

According to still another aspect of the invention, it is contemplated that the decoupling circuits 74, 84, 94 may be configured to decouple magnetic fields generated by currents flowing in different conductive paths within one phase of the multi-phase power module 10. With reference, for example, to FIG. 3, each output phase "U", "V", "W" includes two pairs of IGBTs and anti-parallel connected diodes. The first IGBT and diode pair is connected between the positive DC bus rail 21 and the respective output terminal 12, 14, 16, and the second IGBT and diode pair is connected between the negative DC bus rail 25 and the respective output terminal 12, 14, 16. A control circuit generates the gating signals G1-G6 to selectively enable or disable individual devices and thereby to control the voltage output at each terminal 12, 14, 16. Each phase of the power module 10 includes multiple operating states where, for example, the upper IGBT may be enabled for conduction, the lower IGBT may be enabled for conduction, or neither IGBT is enabled, however, current may be flowing through either of the anti-parallel diodes in that phase. Because each of the power semiconductor devices is connected to the output terminal, current flowing through any one of the devices may also be flowing through the corresponding leadframe 60, 62, 64 connecting the DCB substrate to the output terminal.

In order to achieve a desired output voltage and/or current at each output terminal 12, 14, 16, the different IGBTs may be rapidly switched on and off using pulse width modulation (PWM) techniques. The resulting output voltage is an average value of the positive DC voltage, the negative DC voltage, and zero volts depending on the duration of time the positive DC bus rail 21, the negative DC bus rail 25, or neither rail is connected to the output terminal. In each operating state, current is conducted through different power semiconductor devices and, therefore, through different conduction paths within the phase.

When the leadframes 60, 62, 64 are used, each leadframe has been configured to minimize coupling between elements within a phase. In many applications which utilize the six-pack module, such as motor control, the frequency of the PWM control is within the 100 kHz 5% FBW region. As such, the magnetic field generated by the current conducted within each leadframe is suitable for current sensing without decoupling intra-phase currents. However, if the application requirements include high frequency currents beyond the 5% FBW region, intra-phase decoupling may be required with the leadframes. In addition, it is contemplated that some embodiments will utilize the GMR detectors 72, 82, 92 and decoupling circuits 74, 84, 94 in a power semiconductor module without the leadframes. Traditional wire bonding techniques may be employed to join the DCB substrate to the output terminals. In either instance, if intra-phase decoupling is desired, it is contemplated that the circuit board 70 will be sized to cover the connections (e.g., either leadframes or wire bonds) between the DCB substrate and the output terminals as well as the other wire bond connections between semiconductor devices in each phase. A second GMR detector for each phase will be included on the circuit board 70 and positioned above one of the wire bond connections or other segments of the DCB substrate in which current sensing is desired.

The two GMR detectors for use in intra-phase decoupling are located on the circuit board 70 and proximate two conductors within the phase. If intra-phase decoupling is desired in combination with a leadframe, the first GMR detector is preferably located in a location similar to that described above with a single GMR detector and leadframe configuration. If intra-phase decoupling is used because there is no leadframe, the first GMR detector is preferably located over the set of bonding wires that span between the DCB substrate and output terminal block instead of a leadframe. In either application, the second GMR detector is preferably located over a set of bonding wires in another location within the phase. The selection of the second location includes a magnetic field that is generated as a function of the current flowing between the DCB substrate and output terminal block and as a function of the current to be decoupled. The output of both GMR detectors is provided to the decoupling circuit.

The decoupling circuit is configured to decouple the intra-phase currents in a manner similar to that described above for inter-phase decoupling. A decoupling equation is prepared to identify coefficients defining the effect of the first current and the second current on generating the magnetic field at each of the two locations of the GMR detectors. The decoupling equation is implemented in a linear circuit, for example, with operational amplifiers and a resistive network. At least a portion of the resistors in the resistive network are preferably trimmable to adjust the coefficients and to improve the decoupling of the two currents, such that a signal corresponding to the desired current may be output from the decoupling circuit.

It is noted that terms related to direction used herein are not intended to be limiting. Rather, the terms provide a relational description of elements with respect to other elements. For example, terms such as top, bottom, upper, lower, right, left, side, end, front, back, and the like describe a relationship of an element within a figure or with respect to another element. It is understood that elements may often be reversed or arranged in different configurations as would be understood by one of ordinary skill in the art without deviating from the scope of the invention.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

We claim:
1. A current sensor for integration in a power semiconductor module, the current sensor comprising:
a first electrical conductor including:
a first end configured to be electrically connected to a first conductive substrate within the power semiconductor module, wherein the first conductive substrate is electrically connected to a first switching element within the power semiconductor module, and
a second end configured to be electrically connected to a first terminal of the power semiconductor module;
a second electrical conductor including:
a first end configured to be electrically connected to a second conductive substrate within the power semiconductor module, wherein the second conductive substrate is electrically connected to a second switching element within the power semiconductor module, and
a second end configured to be electrically connected to a second terminal of the power semiconductor module;
a first magnetic field detector mounted adjacent to a predefined location on the first electrical conductor, wherein the first magnetic field detector generates a first signal corresponding to a first magnetic field present at the first magnetic field detector, the first magnetic field generated by a first current conducted within the first switching element and by a second current conducted within the power semiconductor module;
a second magnetic field detector mounted at a second location within the power semiconductor module, wherein the second magnetic field detector generates a second signal corresponding to a second magnetic field present at the second magnetic field detector, the second magnetic field generated by the first current conducted within the first switching element and by the second current conducted within the power semiconductor module; and
a decoupling circuit mounted within the power semiconductor module, wherein the decoupling circuit is configured to receive the first signal and the second signal as inputs and to generate an output signal corresponding to the first current.

2. The current sensor of claim 1 wherein the second magnetic field detector is mounted adjacent to a second predefined location within the power semiconductor device along which the first current is conducted and wherein the decoupling circuit is configured to decouple intra-phase currents.

3. The current sensor of claim 1 wherein:
the second current is conducted through the second switching element,
the second magnetic field detector is mounted adjacent to a predefined location on the second electrical conductor, and
the decoupling circuit is configured to decouple interphase currents.

4. The current sensor of claim 1 wherein the first magnetic field detector and the second magnetic field detector are each magneto resistive magnetic field detectors.

5. The current sensor of claim 1 wherein:
the power semiconductor module is configured to generate a multiphase output,
the first current corresponds to a current conducted in a first phase of the multiphase output, and
the second current corresponds to a current conducted in a second phase of the multiphase output.

6. The current sensor of claim 1 wherein:
the first electrical conductor further includes a first conductive body extending between the first end and the second end of the first electrical conductor,
the first conductive body has a first predefined spatial geometry including a plurality of planar surfaces,
each planar surface of the first conductive body is orthogonally connected to at least one of the other planar surfaces of the first conductive body,
the second electrical conductor further includes a second conductive body extending between the first end and the second end of the second electrical conductor,
the second conductive body has a second predefined spatial geometry including a plurality of planar surfaces, and
each planar surface of the second conductive body is orthogonally connected to at least one of the other planar surfaces of the second conductive body.

7. The current sensor of claim 6 wherein the first and the second predefined locations each has a normalized magnetic field strength that deviates less than five percent over a predefined range of current conducted through the corresponding electrical conductor and wherein the predefined range of current has a uniform amplitude and a varying frequency between zero hertz and one hundred kilohertz.

8. The current sensor of claim 1 wherein the decoupling circuit includes a linear circuit configured to execute a decoupling matrix.

9. The current sensor of claim 8 wherein the linear circuit includes at least one electronic device defining a coefficient of the decoupling matrix that is laser trimmable to adjust a component value from an initial component value to a final component value.

10. The current sensor of claim 1, wherein:
the power semiconductor module is configured to output a three-phase output,
the decoupling circuit is a first decoupling circuit,
the second current is conducted through the second switching element, and
the second magnetic field detector is mounted adjacent to a predefined location on the second electrical conductor, the current sensor further comprising:
a third electrical conductor including:
a first end configured to be electrically connected to a third conductive substrate within the power semiconductor module, wherein the third conductive substrate is electrically connected to a third switching element within the power semiconductor module, and
a second end configured to be electrically connected to a third terminal of the power semiconductor module;
a third magnetic field detector mounted adjacent to a predefined location on the third electrical conductor, wherein the third magnetic field detector generates a third signal corresponding to a third magnetic field present at the third magnetic field detector, the third magnetic field generated by a third current conducted within the third switching element and by the second current;
a second decoupling circuit mounted within the power semiconductor module, wherein the second decoupling circuit is configured to receive at least the first signal and the second signal as inputs and to generate an output signal corresponding to the second current; and a third decoupling circuit mounted within the power semiconductor module, wherein the third decoupling circuit is configured to receive at least the second signal and the third signal as inputs and to generate an output signal corresponding to the third current.

11. The current sensor of claim 10, wherein:
the first magnetic field is generated as a function of the first current conducted within the first switching element, the second current conducted within the second switching element, and the third current conducted within the third switching element,
the second magnetic field is generated as a function of the first current conducted within the first switching element, the second current conducted within the second switching element, and the third current conducted within the third switching element,
the third magnetic field is generated as a function of the first current conducted within the first switching element, the second current conducted within the second switching element, and the third current conducted within the third switching element,
the first decoupling circuit is configured to receive the first signal, the second signal, and the third signal as inputs and to generate a first output signal corresponding to the first current,
the second decoupling circuit is configured to receive the first signal, the second signal, and the third signal as inputs and to generate a second output signal corresponding to the second current, and
the third decoupling circuit is configured to receive the first signal, the second signal, and the third signal as inputs and to generate a third output signal corresponding to the third current.

12. A method for integrating a current sensor in a power semiconductor module, the method comprising the steps of:
mounting a first magnetic field detector at a first location in the power semiconductor module, wherein:
the first magnetic field detector generates a first feedback signal corresponding to a first magnetic field present at the first magnetic field detector and generated in response to at least a first current and a second current,
the first current is conducted in a first electrical conductor within the power semiconductor module, and
the second current is conducted within the power semiconductor module,
mounting a second magnetic field detector at a second location in the power semiconductor module, wherein the second magnetic field detector generates a second feedback signal corresponding to a second magnetic field present at the second magnetic field detector and generated in response to at least the first current and the second current; and
mounting a decoupling circuit within the power semiconductor module, wherein:
the first feedback signal and the second feedback signal are connected as inputs to the decoupling circuit, and
the decoupling circuit generates an output signal corresponding to the first current as a function of the first feedback signal and of the second feedback signal.

13. The method of claim 12 wherein:
the first current and the second current are each conducted through a first switching element within the power semiconductor module,
the first location is different than the second location, and
the decoupling circuit is configured to decouple intra-phase currents.

14. The method of claim 12 wherein:
the first current is conducted through a first switching element,
the second current is conducted through a second switching element, and
the decoupling circuit is configured to decouple inter-phase currents.

15. The method of claim 12 further comprising an initial step of:
connecting the first electrical conductor between a first electrical connection point and a second electrical connection point within the power semiconductor module, wherein:
the first electrical conductor has a definite spatial geometry between the first and the second electrical connection points,
the first electrical connection point is a conductive substrate connected to a first switching element within the power semiconductor module,
the second electrical connection point is a first output terminal; and
the first location is a predefined location adjacent to the first electrical conductor.

16. The method of claim 15 wherein:
the first electrical conductor further includes a conductive body extending between a first end and a second end,
the conductive body has a plurality of planar surfaces, and
each planar surface of the conductive body is orthogonally connected to at least one of the other planar surfaces.

17. The method of claim 15 wherein the power semiconductor module is configured to generate a multiphase output, the method further comprising the step of:
connecting a second electrical conductor between a third electrical connection point and a fourth connection point within the power semiconductor module, wherein:
the second electrical conductor has a definite spatial geometry between the third and the fourth electrical connection points,
the third electrical connection point is a second conductive substrate connected to a second switching element within the power semiconductor module,
the fourth electrical connection point is a second output terminal,
the first electrical conductor corresponds to a first output phase,
the first current is conducted in the first electrical conductor,
the second electrical conductor corresponds to a second output phase, and
the second current is conducted in the second electrical conductor.

18. The method of claim 17 wherein:
the decoupling circuit includes a linear circuit configured to execute a decoupling matrix, and
the linear circuit includes at least one electronic device that is laser trimmable to adjust a component value from an initial component value to a final component value.

19. The method of claim 17 further comprising the steps of:
mounting a third magnetic field detector at a third location in the power semiconductor module, wherein the third magnetic field detector generates a third feedback signal corresponding to a third magnetic field present at the third magnetic field detector and generated in response to a third current and the second current;

connecting a third electrical conductor between a fifth electrical connection point and a sixth electrical connection point within the power semiconductor module, wherein:
- the third electrical conductor has a definite spatial geometry between the fifth and the sixth electrical connection points,
- the fifth electrical connection point is a third conductive substrate connected to a third switching element within the power semiconductor module,
- the sixth electrical connection point is a third output terminal,
- the third electrical conductor corresponds to a third output phase, and
- the third current is conducted in the third electrical conductor.

20. The method of claim 19, wherein:
the first magnetic field is generated as a function of the first current, the second current, and the third current, the second magnetic field is generated as a function of the first current, the second current, and the third current, the third magnetic field is generated as a function of the first current, the second current, and the third current, the decoupling circuit is a first decoupling circuit configured to receive the first signal, the second signal, and the third signal as inputs and to generate a first output signal corresponding to the first current, the method further comprising the steps of:

mounting a second decoupling circuit within the power semiconductor module, the second decoupling circuit configured to receive the first signal, the second signal, and the third signal as inputs and to generate a second output signal corresponding to the second current; and mounting a third decoupling circuit within the power semiconductor module, the third decoupling circuit configured to receive the first signal, the second signal, and the third signal as inputs and to generate a third output signal corresponding to the third current.

* * * * *